(12) United States Patent
Yen et al.

(10) Patent No.: US 11,664,339 B2
(45) Date of Patent: May 30, 2023

(54) PACKAGE STRUCTURE AND METHOD FOR MANUFACTURING THE SAME

(71) Applicant: Advanced Semiconductor Engineering, Inc., Kaohsiung (TW)

(72) Inventors: You-Lung Yen, Kaohsiung (TW); Bernd Karl Appelt, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 309 days.

(21) Appl. No.: 16/854,730

(22) Filed: Apr. 21, 2020

(65) Prior Publication Data

US 2021/0327841 A1 Oct. 21, 2021

(51) Int. Cl.

| | | |
|---|---|---|
| H01L 23/00 | (2006.01) | |
| H01L 21/48 | (2006.01) | |
| H01L 21/56 | (2006.01) | |
| H01L 23/31 | (2006.01) | |
| H01L 23/538 | (2006.01) | |
| H01L 23/498 | (2006.01) | |
| H01L 23/544 | (2006.01) | |
| H01L 25/065 | (2006.01) | |
| H01L 21/683 | (2006.01) | |

(52) U.S. Cl.
CPC .......... *H01L 24/20* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5386* (2013.01); *H01L 24/19* (2013.01); *H01L 2224/214* (2013.01)

(58) Field of Classification Search
CPC .......... H01L 24/20; H01L 23/5386; H01L 2224/214; H01L 2223/54426
See application file for complete search history.

(56) References Cited

U.S. PATENT DOCUMENTS

2016/0133562 A1* 5/2016 Lee .................. H01L 21/481
 438/126
2018/0352658 A1* 12/2018 Yang ................ H01L 24/25

\* cited by examiner

*Primary Examiner* — Antonio B Crite
(74) *Attorney, Agent, or Firm* — Foley & Lardner LLP

(57) ABSTRACT

A package structure and a manufacturing method are provided. The package structure includes a first circuit layer, a first dielectric layer, an electrical device and a first conductive structure. The first circuit layer includes a first alignment portion. The first dielectric layer covers the first circuit layer. The electrical device is disposed on the first dielectric layer, and includes an electrical contact aligning with the first alignment portion. The first conductive structure extends through the first alignment portion, and electrically connects the electrical contact and the first alignment portion.

12 Claims, 34 Drawing Sheets

PACKAGE STRUCTURE AND METHOD FOR MANUFACTURING THE SAME

BACKGROUND

1. Field of the Disclosure

The present disclosure relates to a package structure and a manufacturing method, and to a package structure including a conductive structure extending through a circuit layer and connecting an electrical device, and a method for manufacturing the same.

2. Description of the Related Art

In a conventional semiconductor flip-chip bonding method, a solder is formed on a circuit layer of a substrate. Then, a semiconductor die is placed on the substrate, so that the solder contacts the die pad of the semiconductor die. After a reflow process, the solder is melted to join to the die pad so as to form a semiconductor flip-chip bonded device. During the reflow process, the solder may react with the die pad of the semiconductor die so as to form intermetallic compounds (IMC). Typically, the material of the solder is a tin silver alloy (e.g., SnAg), the material of the die pad is copper (Cu), and the material of an IMC is thus a combination of tin, silver and copper, such as $Cu_6Sn_5$, $Ni_6Sn_5$, $Cu_3Sn_4$ or $Ni_3Sn_4$. A thicker IMC layer will reduce the shear strength of the semiconductor flip-chip bonded device because the IMCs are brittle, which can result in joint crack. Further, the material of the solder is different from the materials of the die pad and the circuit layer, which may adversely influence the electrical transmission between the die pads and the circuit layer. In addition, during the reflow process, some of the die pads of the semiconductor die may not contact the solder due to a warpage of the substrate. Thus, the joint quality between the die pads of the semiconductor die and the circuit layer of the substrate is poor, and a yield of the semiconductor flip-chip bonded device may decrease.

SUMMARY

In some embodiments, a package structure includes a first circuit layer, a first dielectric layer, an electrical device and a first conductive structure. The first circuit layer includes a first alignment portion. The first dielectric layer covers the first circuit layer. The electrical device is disposed on the first dielectric layer, and includes an electrical contact aligning with the first alignment portion. The first conductive structure extends through the first alignment portion, and electrically connects the electrical contact and the first alignment portion.

In some embodiments, a manufacturing method includes: (a) forming a first circuit layer on a first carrier; (b) forming a first dielectric layer to cover the first circuit layer; (c) attaching an electrical device on the first dielectric layer; (d) removing the first carrier; and (e) forming a first conductive structure to extend through the first circuit layer and electrically connect to the electrical device and the first circuit layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
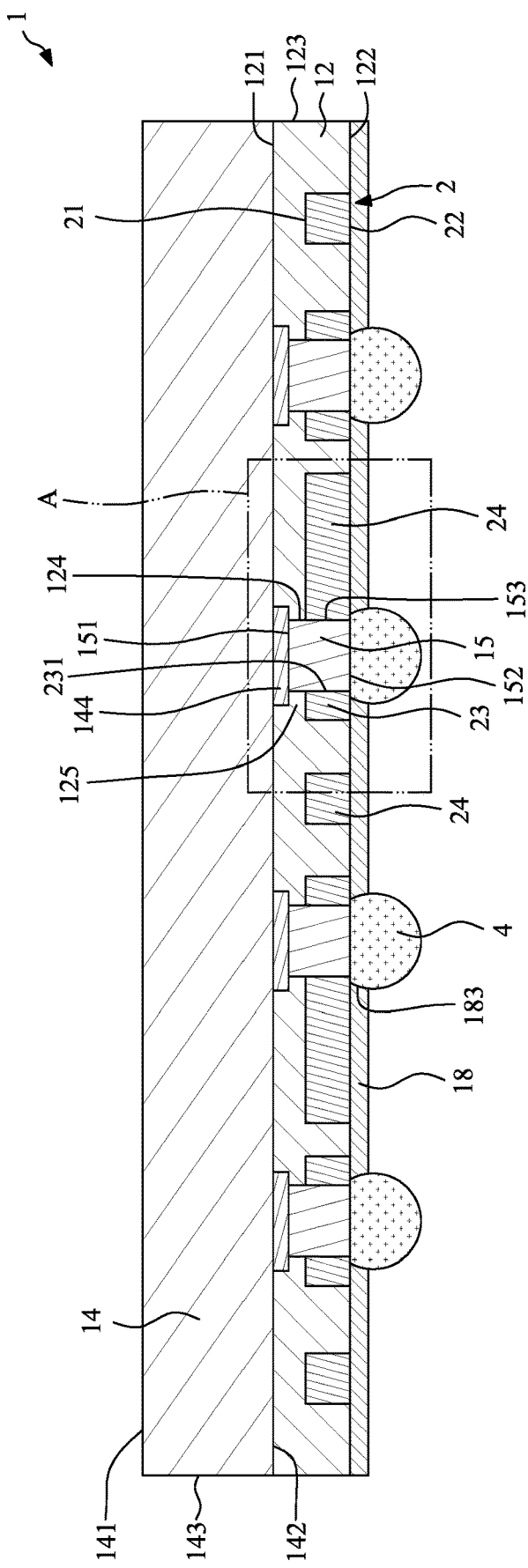
FIG. 1 illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a package structure without soldering material. At least some embodiments of the present disclosure further provide for techniques for manufacturing the package structure.

FIG. 1 illustrates a cross-sectional view of a package structure 1 according to some embodiments of the present disclosure. The package structure 1 may include a circuit layer 2, a dielectric layer 12, an electrical device 14, at least one conductive structure 15, protection layer 18 and at least one external connector 4. In some embodiments, the circuit layer 2 may be also referred to as a first circuit layer, the dielectric layer 12 may be also referred to as a first dielectric layer, and the conductive structure 15 may be also referred to as a first conductive structure.

The circuit layer 2 may be a single layered redistribution layer, and a material of the circuit layer 2 may include, for example, copper, another conductive metal, or an alloy thereof. For example, the circuit layer 2 may be a fan-in circuit layer or a fan-out circuit layer. As shown in FIG. 1, the circuit layer 2 may have a first surface 21 (e.g., top surface) and a second surface 22 (e.g., bottom surface) opposite to the first surface 21 (e.g., top surface). The circuit layer 2 may include at least one alignment portion 23 and at least one trace portion 24 electrically connected to the alignment portion 23. The alignment portion 23 of the circuit layer 2 may define a through hole 231 extending through the circuit layer 2.

The dielectric layer 12 may cover the circuit layer 2. The dielectric layer 12 may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof. The dielectric layer 12 may have a first surface 121 (e.g., top surface), a second surface 122 (e.g., bottom surface) opposite to the first surface 121 (e.g., top surface), and a lateral side surface 123 extending between the first surface 121 (e.g., top surface) and the second surface 122 (e.g., bottom surface). The first surface 121 (e.g., top surface) of the dielectric layer 12 may be higher than the first surface 21 (e.g., top surface) of the circuit layer 2. The second surface 122 (e.g., bottom surface) of the dielectric layer 12 may be substantially coplanar with the second surface 22 (e.g., bottom surface) of the circuit layer 2. Thus, a bottom surface of the alignment portion 23, a bottom surface of the trace portion 24 and a bottom surface 22 of the dielectric layer 12 are substantially coplanar.

The electrical device 14 may be a semiconductor die or semiconductor chip, and may have a first surface 141 (e.g., top surface), a second surface 142 (e.g., bottom surface) opposite to the first surface 141 (e.g., top surface), and a lateral side surface 143 extending between the first surface 141 (e.g., top surface) and the second surface 142 (e.g., bottom surface). The second surface 142 (e.g., bottom surface) of the electrical device 14 may be an active surface. The electrical device 14 may include at least one electrical contact 144 (e.g., connecting pad or bonding pad such as die pad or chip pad) protruding from the second surface 142 (e.g., bottom surface). A material of the electrical contact 144 may include, for example, copper, another conductive metal, or an alloy thereof. As shown in FIG. 1, the electrical device 14 is disposed on the dielectric layer 12, and the second surface 142 (e.g., bottom surface) of the electrical device 14 may be attached to or contact the first surface 121 (e.g., top surface) of the dielectric layer 12. Thus, the electrical contact 144 of the electrical device 14 aligns with the alignment portion 23 of the circuit layer 2, and the position of the electrical contact 144 of the electrical device 14 corresponds to the position of a respective one of the alignment portion 23 of the circuit layer 2. That is, the electrical contact 144 of the electrical device 14 is aligned with the alignment portion 23 of the circuit layer 2. In some embodiments, the electrical contact 144 of the electrical device 14 may be embedded in the dielectric layer 12. However, in other embodiments, the electrical contact 144 may be recessed from and exposed from the second surface 142 (e.g., bottom surface). In addition, the lateral side surface 143 of the electrical device 14 may be substantially coplanar with the lateral side surface 123 of the dielectric layer 12.

As shown in FIG. 1, a portion 125 of the dielectric layer 12 may be interposed between the alignment portion 23 of the circuit layer 2 and the electrical contact 144 or the second surface 142 (e.g., bottom surface) of the electrical device 14. That is, the alignment portion 23 of the circuit layer 2 is spaced apart from the electrical contact 144 or the second surface 142 (e.g., bottom surface) of the electrical device 14 by the portion 125 of the dielectric layer 12. In addition, the portion 125 of the dielectric layer 12 defines a through hole 124 in communication with the through hole 231 of the alignment portion 23 of the circuit layer 2. The through hole 124 of the dielectric layer 12 is disposed between the alignment portion 23 of the circuit layer 2 and the electrical contact 144 of the electrical device 14. In some embodiments, the through hole 124 of the dielectric layer 12 may be aligned with the through hole 231 of the alignment portion 23 of the circuit layer 2, and they may be formed concurrently at an etching stage to form a single and continuous through hole to expose a portion of the electrical contact 144 of the electrical device 14. In some embodiments, cross-sectional views of the inner wall of the through hole 124 of the dielectric layer 12 and the inner wall of the through hole 231 of the alignment portion 23 of the circuit layer 2 may be substantially straight lines.

The conductive structure 15 is disposed in the through hole 124 of the dielectric layer 12 and the through hole 231 of the alignment portion 23 of the circuit layer 2. Thus, the conductive structure 15 extends through the dielectric layer 12 and the alignment portion 23 of the circuit layer 2, and connects the electrical contact 144 of the electrical device 14. The alignment portion 23 and the conductive structure 15 may be not formed concurrently. In some embodiments, the conductive structure 15 may be integrally formed as a monolithic structure or a one-piece structure. Thus, a cross-sectional view of one side of the conductive structure 15 is a substantially continuous straight line without boundary. In some embodiments, the profile of the conductive structure 15 may be determined by the inner wall of the through hole 124 of the dielectric layer 12 and the inner wall of the through hole 231 of the alignment portion 23 of the circuit layer 2.

A material of the conductive structure 15 may include, for example, copper, another conductive metal, or an alloy thereof. In some embodiments, the material of the conductive structure 15 may be same as the material of the electrical contact 144 of the electrical device 14 and the material of the circuit layer 2. Thus, the conductive structure 15 may be not a solder material such as SnAg alloy. For example, the conductive structure 15 may be formed from a metal paste (e.g., copper paste) through a printing process. Alternatively, the conductive structure 15 may be a plated metal (e.g., plated copper) that is formed through a plating process.

The conductive structure 15 may be in a column or a pillar shape, and may have a first surface 151 (e.g., top surface), a second surface 152 (e.g., bottom surface) opposite to the first surface 151 (e.g., top surface), and a lateral side surface 153 extending between the first surface 151 (e.g., top surface) and the second surface 152 (e.g., bottom surface). The first surface 151 (e.g., top surface) of the conductive structure 15 may be physically connected to the electrical contact 144 of the electrical device 14 directly. That is, the first surface 151 (e.g., top surface) of the conductive structure 15 may contact the electrical contact 144 of the electrical device 14 directly. In addition, the lateral side surface 153 of the conductive structure 15 may be physically connected to the alignment portion 23 of the circuit layer 2 directly. That is, the lateral side surface 153 of the conductive structure 15 may contact the alignment portion 23 of the circuit layer 2 directly. As shown in FIG. 1, a thickness of the conductive structure 15 may be greater than a thickness of the circuit layer 2. A portion of the conductive structure 15 may protrude from the circuit layer 2.

The protection layer 18 (e.g., solder mask) is disposed on the second surface 122 (e.g., bottom surface) of the dielectric layer 12 and the second surface 22 (e.g., bottom surface) of the circuit layer 2. In some embodiments, the protection layer 18 (e.g., solder mask) covers and contacts the second surface 122 (e.g., bottom surface) of the dielectric layer 12 and the second surface 22 (e.g., bottom surface) of the circuit layer 2. As shown in FIG. 1, the protection layer 18 defines at least one opening 183 to expose a portion of the alignment portion 23 of the circuit layer 2 and/or a portion (e.g., the second surface 152) of the conductive structure 15. The external connector 4 (e.g., solder ball or solder bump) may be disposed in the opening 183 of the protection layer 18 and on the exposed portion of the alignment portion 23 of the circuit layer 2 and/or the exposed portion of the conductive structure 15.

In the embodiment illustrated in the FIG. 1, the electrical contact 144 of the electrical device 14 is electrically connected to the circuit layer 2 through the conductive structure 15. Thus, no solder is needed to connect the electrical contact 144 of the electrical device 14 and the circuit layer 2. Further, no reflow process is needed to be conducted. In addition, the material of the conductive structure 15 may be same as the material of the electrical contact 144 of the electrical device 14 and the material of the circuit layer 2, which may prevent the formation of intermetallic compounds (IMC). As a result, the joint quality between the electrical contact 144 of the electrical device 14 and the circuit layer 2 is improved, and a yield of the package structure 1 may also be improved.

Figure 2:
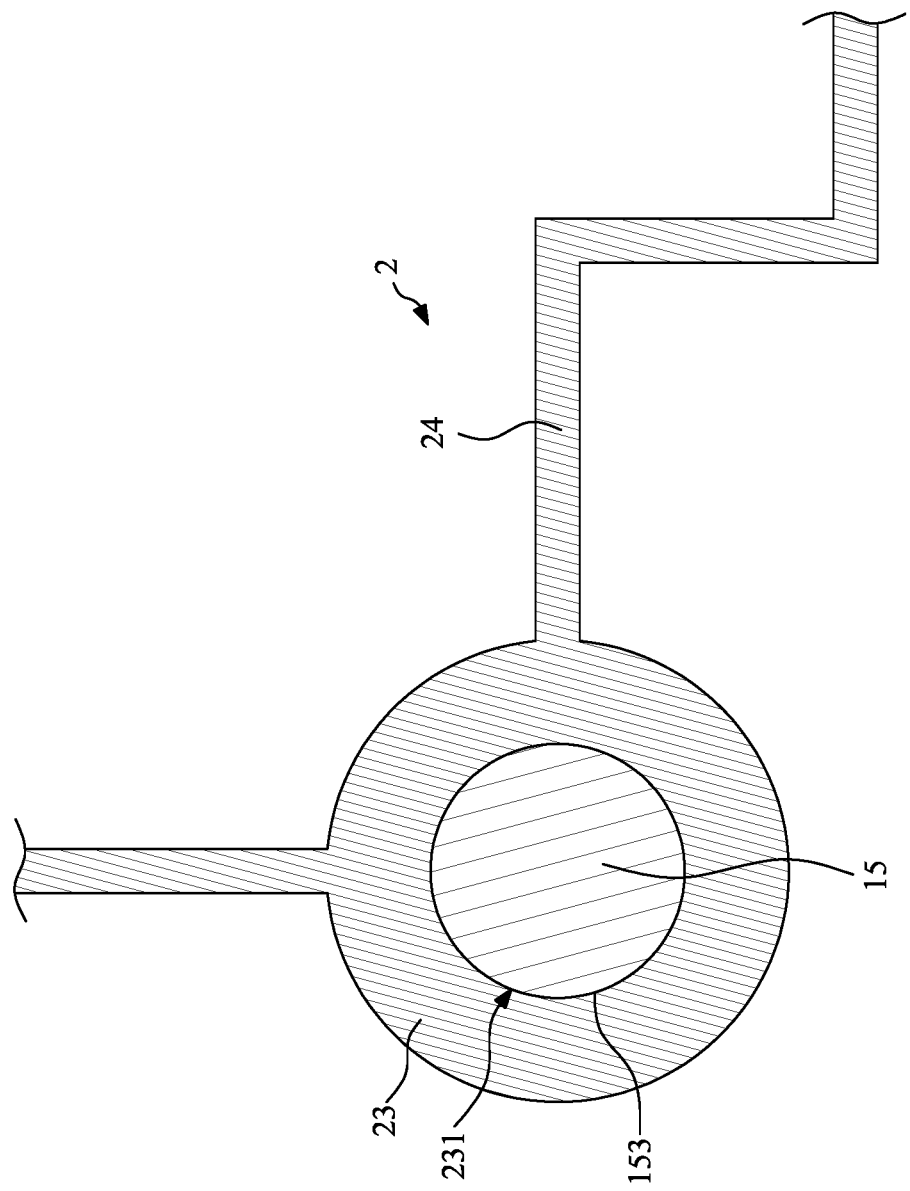
FIG. 2 illustrates a top view of a portion of the circuit layer of FIG. 1, wherein an electrical device and a dielectric layer are omitted for the purpose of the clear explanation.

FIG. 2 illustrates a top view of a portion of the circuit layer 2 of FIG. 1, wherein the electrical device 14 and the dielectric layer 12 are omitted for the purpose of the clear explanation. As shown in FIG. 2, the alignment portion 23 of the circuit layer 2 is a continuous ring or loop structure, and encloses the conductive structure 15. The alignment portion 23 may define a complete through hole 231, and the conductive structure 15 may be disposed in the through hole 231.

Figure 3:
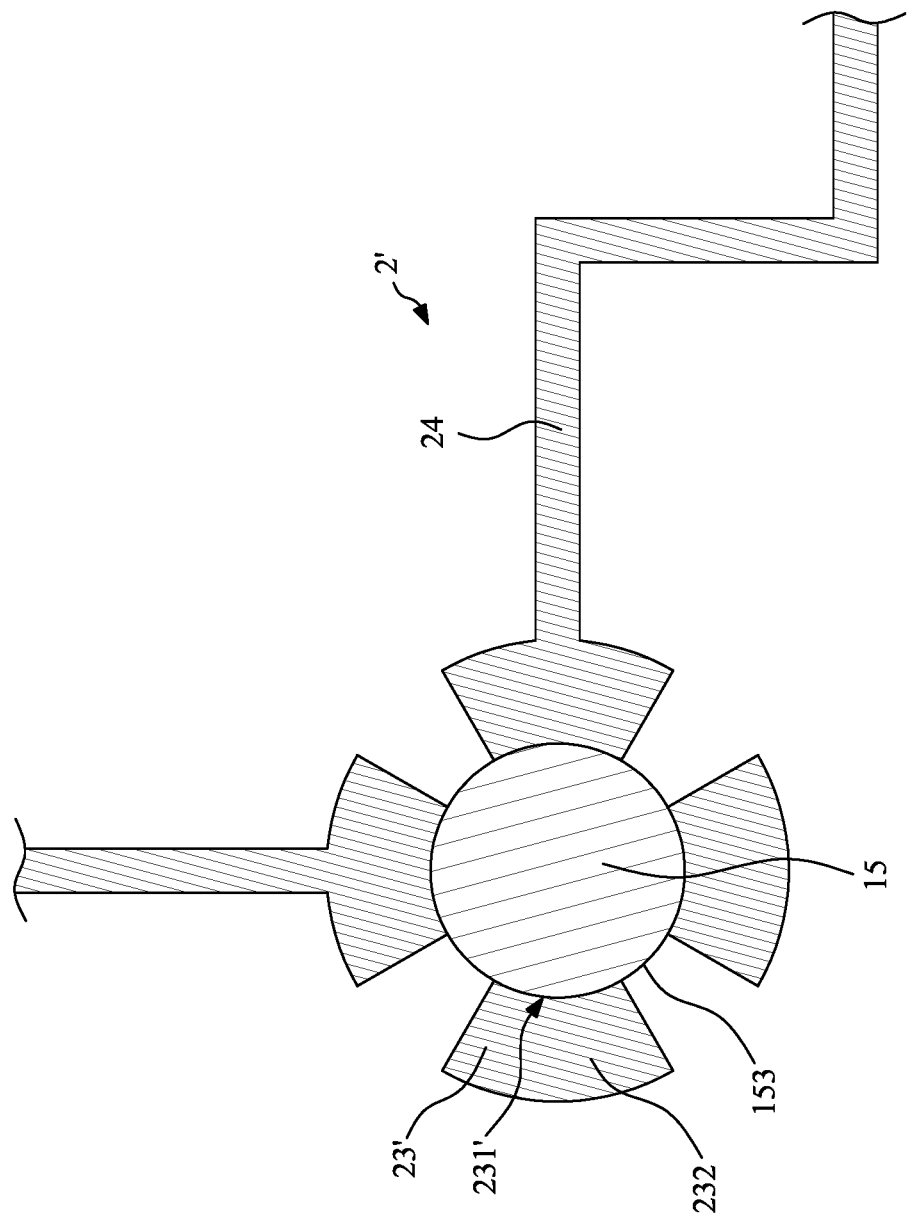
FIG. 3 illustrates a top view of a portion of a circuit layer, wherein an electrical device and a dielectric layer are omitted for the purpose of the clear explanation.

FIG. 3 illustrates a top view of a portion of a circuit layer 2', wherein an electrical device and a dielectric layer are omitted for the purpose of the clear explanation. The circuit layer 2' of FIG. 3 is similar to the circuit layer 2 of FIG. 1 and FIG. 2, except for a structure of the alignment portion 23' of the circuit layer 2'. As shown in FIG. 3, the alignment portion 23' of the circuit layer 2' is a discontinuous ring or loop structure, and encloses the conductive structure 15. The alignment portion 23 may include a plurality of separate segments 232. Each of the separate segments 232 may be a portion of a ring, and the separate segments 232 surround to define an accommodating space 231' which is not a complete circle. In addition, the conductive structure 15 may be disposed in the accommodating space 231'.

Figure 4:
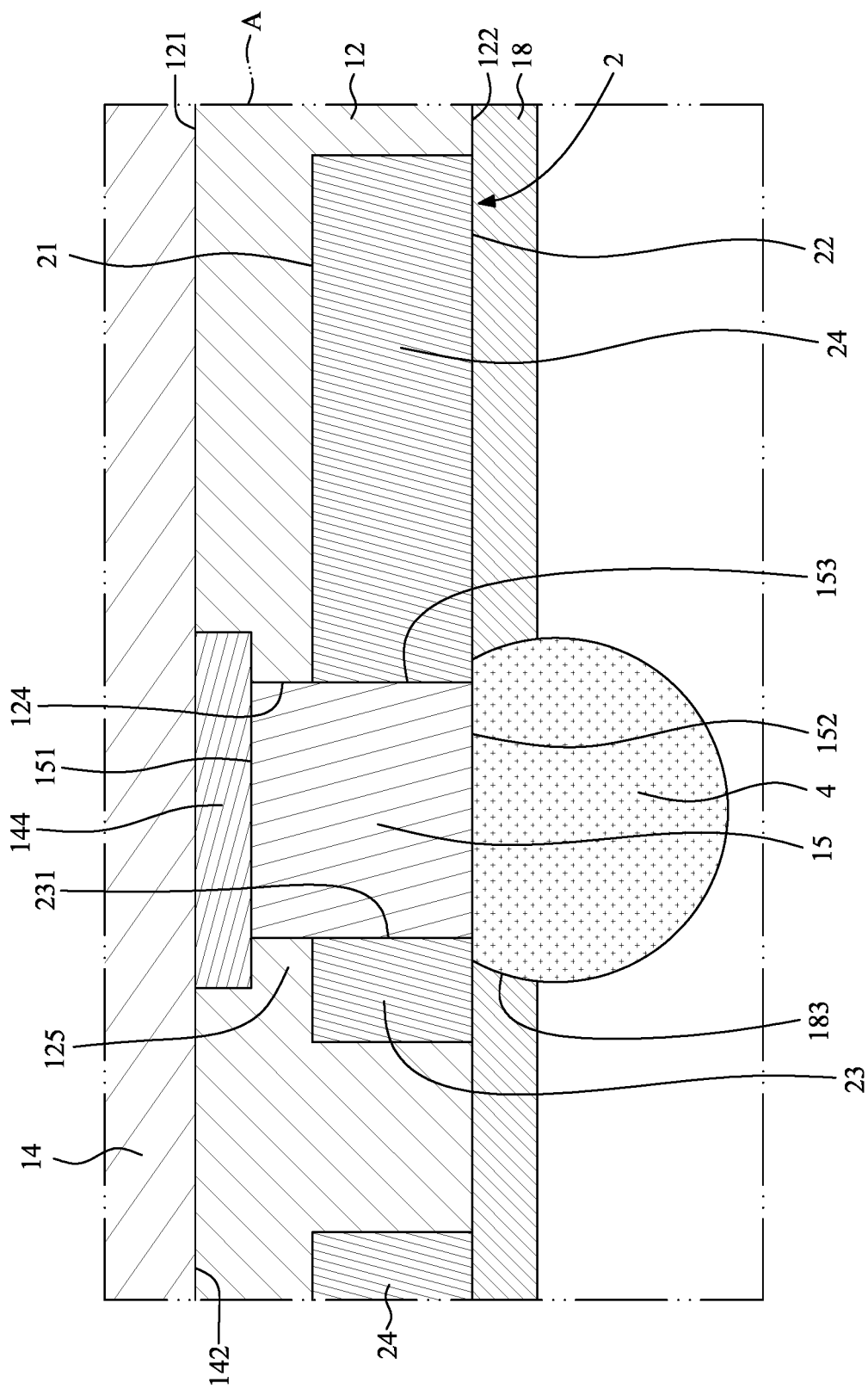
FIG. 4 illustrates an enlarged view of a region "A" in FIG. 1.

FIG. 4 illustrates an enlarged view of a region "A" in FIG. 1. As shown in FIG. 4, the second surface 152 (e.g., bottom surface) of the conductive structure 15 may be substantially coplanar with the second surface 122 (e.g., bottom surface) of the dielectric layer 12 and the second surface 22 (e.g., bottom surface) of the circuit layer 2.

Figure 5:
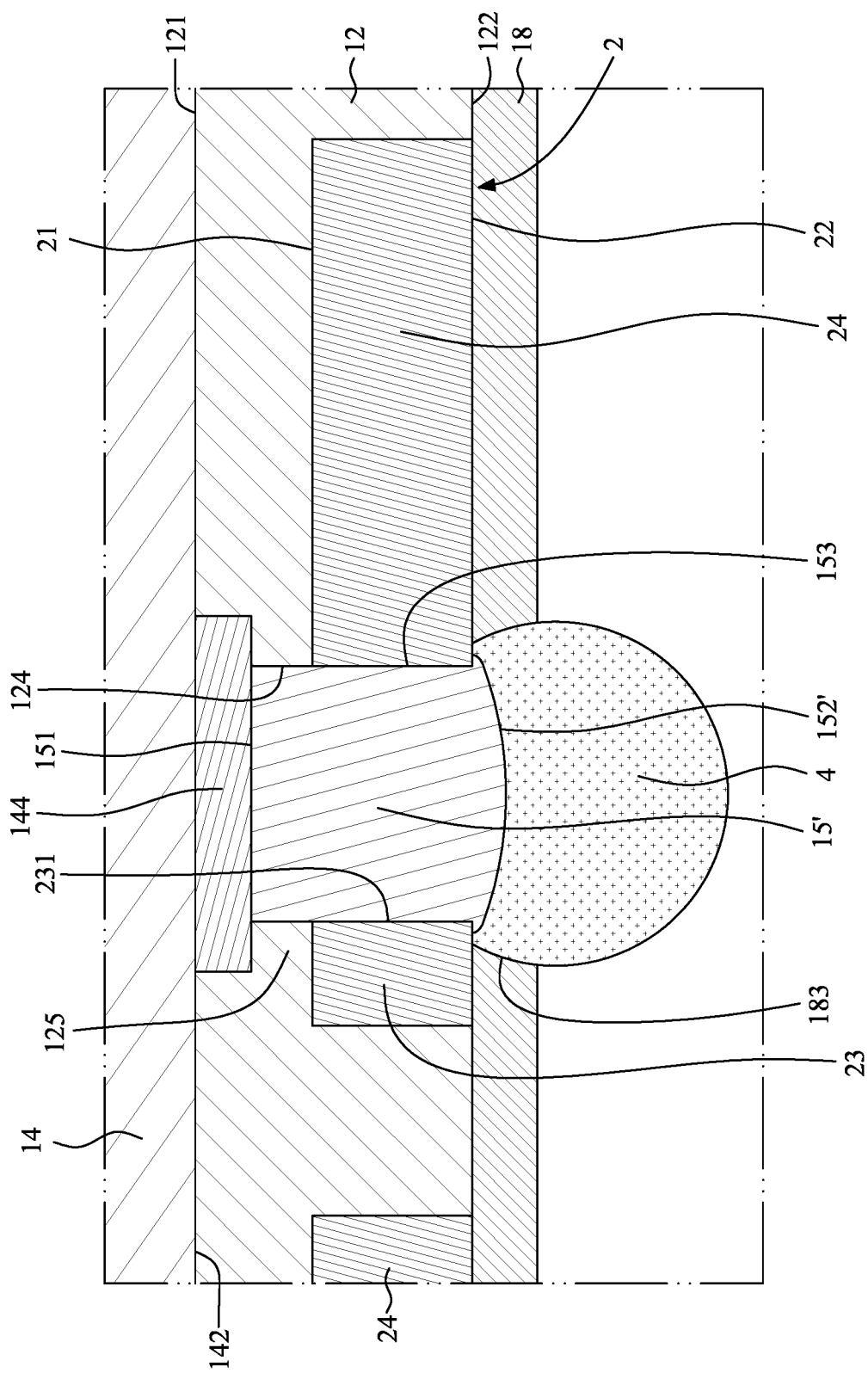
FIG. 5 illustrates an enlarged view of a conductive structure according to some embodiments of the present disclosure.

FIG. 5 illustrates an enlarged view of a conductive structure 15' according to some embodiments of the present disclosure. The conductive structure 15' of FIG. 5 is similar to the conductive structure 15 of FIG. 1 and FIG. 4, except that a bottom portion of the conductive structure 15' extends beyond the second surface 22 (e.g., bottom surface) of the alignment portion 23 of the circuit layer 2. Thus, the second surface 152' (e.g., bottom surface) of the conductive structure 15' may protrude from the second surface 22 (e.g., bottom surface) of the alignment portion 23 of the circuit layer 2. In addition, the bottom portion of the conductive structure 15' may cover and physically contact a portion of the second surface 22 (e.g., bottom surface) of the alignment portion 23 of the circuit layer 2. Thus, the conductive structure 15' may physically contact the second surface 22 (e.g., bottom surface) of the circuit layer 2.

Figure 6:
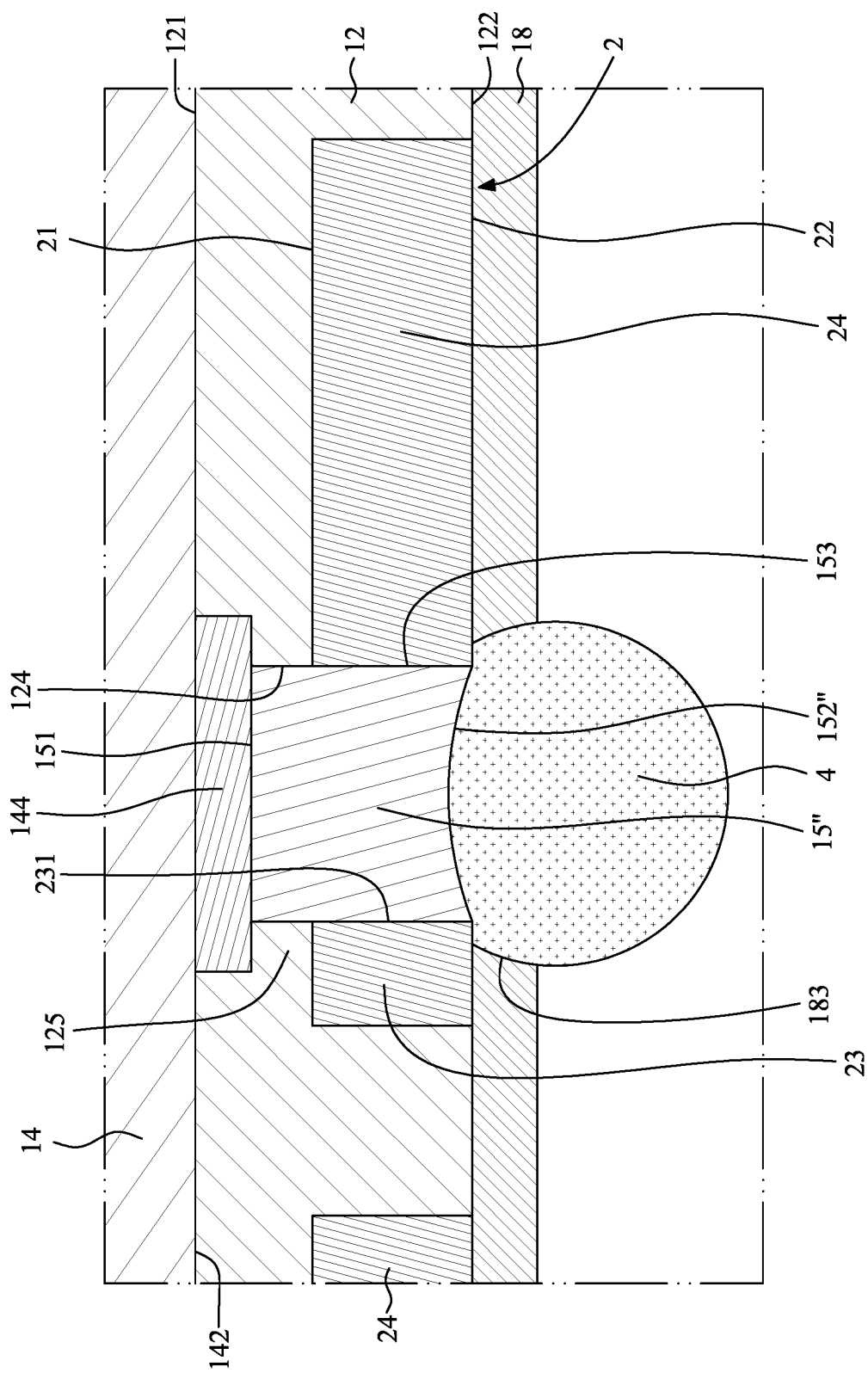
FIG. 6 illustrates an enlarged view of a conductive structure according to some embodiments of the present disclosure.

FIG. 6 illustrates an enlarged view of a conductive structure 15" according to some embodiments of the present disclosure. The conductive structure 15" of FIG. 6 is similar to the conductive structure 15 of FIG. 1 and FIG. 4, except that a second surface 152" (e.g., bottom surface) of the conductive structure 15" may be recessed from the second surface 22 (e.g., bottom surface) of the alignment portion 23 of the circuit layer 2.

Figure 7:
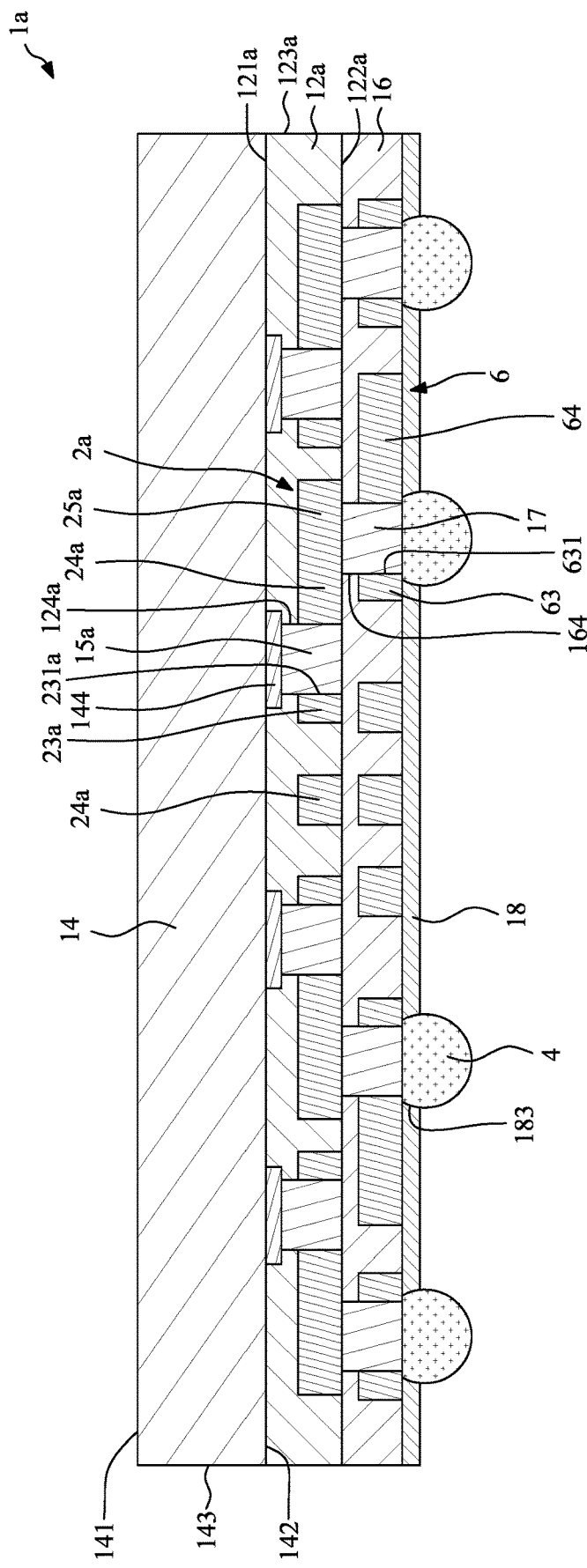
FIG. 7 illustrates a cross-sectional view of a package structure according to some embodiments of the present disclosure.

FIG. 7 illustrates a cross-sectional view of a package structure 1a according to some embodiments of the present disclosure. The package structure 1a may include a first circuit layer 2a, a first dielectric layer 12a, an electrical device 14, at least one first conductive structure 15a, a second circuit layer 6, a second dielectric layer 16, at least one second conductive structure 17, a protection layer 18 and at least one external connector 4.

The first circuit layer 2a may be similar to the circuit layer 2, 2' of FIG. 1 to FIG. 6, except that the first circuit layer 2a further includes a pad portion. That is, the first circuit layer 2a may include a first alignment portion 23a, a first trace portion 24a and a first pad portion 25a. The first alignment portion 23a may define a through hole 231a extending through the first circuit layer 2a. The first trace portion 24a is electrically connected to the first alignment portion 23a. The first pad portion 25a is electrically connected to the first trace portion 24a. Thus, the first pad portion 25a may be electrically connected to the first alignment portion 23a through the first trace portion 24a.

The first dielectric layer 12a may cover the first circuit layer 2a. The first dielectric layer 12a may be similar to the dielectric layer 12 of FIG. 1 to FIG. 6. The first dielectric layer 12a may have a first surface 121a (e.g., top surface), a second surface 122a (e.g., bottom surface) opposite to the first surface 121a (e.g., top surface), and a lateral side surface 123a extending between the first surface 121a (e.g., top surface) and the second surface 122a (e.g., bottom surface). In addition, the first dielectric layer 12a may define a through hole 124a in communication with the through hole 231a of the first alignment portion 23a of the first circuit layer 2a.

The electrical device 14 of FIG. 7 may be similar to the electrical device 14 of FIG. 1, and may have a first surface 141 (e.g., top surface), a second surface 142 (e.g., bottom surface) opposite to the first surface 141 (e.g., top surface), and a lateral side surface 143 extending between the first surface 141 (e.g., top surface) and the second surface 142 (e.g., bottom surface). The electrical device 14 may include at least one electrical contact 144 (e.g., connecting pad or bonding pad such as die pad or chip pad) protruding from the second surface 142 (e.g., bottom surface). As shown in FIG. 7, the electrical device 14 is disposed on the first dielectric layer 12a, and the second surface 142 (e.g., bottom surface) of the electrical device 14 may be attached to or contact the first surface 121a (e.g., top surface) of the first dielectric layer 12a. Thus, the electrical contact 144 of the electrical device 14 aligns with the first alignment portion 23a of the first circuit layer 2a, and the position of the electrical contact 144 of the electrical device 14 corresponds to the position of the first alignment portion 23a of the first circuit layer 2a. In some embodiments, the electrical contact 144 of the electrical device 14 may be embedded in the first dielectric layer 12a. A portion of the electrical contact 144 may be exposed from the through hole 124a of the first dielectric layer 12a.

The first conductive structure 15a of FIG. 7 may be similar to the conductive structure 15 of FIG. 1, and may be disposed in the through hole 124a of the first dielectric layer 12a and the through hole 231a of the first alignment portion 23a of the first circuit layer 2a. Thus, the first conductive structure 15a extends through the first dielectric layer 12a and the first alignment portion 23a of the first circuit layer 2a, and is physically and electrically connected to the electrical contact 144 of the electrical device 14. In addition, a first surface (e.g., top surface) of the first conductive structure 15a may contact the electrical contact 144 of the electrical device 14 directly. A lateral side surface of the first conductive structure 15a may be physically connected to the first alignment portion 23a of the first circuit layer 2a directly.

The second circuit layer 6 may be similar to the first circuit layer 2a. In some embodiments, the second circuit layer 6 may include a second alignment portion 63 and a second trace portion 64. The second alignment portion 63 may define a through hole 631 extending through the second circuit layer 6. The second trace portion 64 is electrically connected to the second alignment portion 63.

The second dielectric layer 16 may cover the second circuit layer 6. The second dielectric layer 16 may be similar to the first dielectric layer 12a. The second dielectric layer 16 may define a through hole 164 in communication with the through hole 631 of the second alignment portion 63 of the second circuit layer 16. As shown in FIG. 7, the first circuit layer 2a and the first dielectric layer 12a are disposed on the second dielectric layer 16.

The second conductive structure 17 may be similar to the first conductive structure 15a, and may be disposed in the through hole 164 of the second dielectric layer 16 and the through hole 631 of the second alignment portion 63 of the second circuit layer 6. Thus, the second conductive structure 17 extends through the second dielectric layer 16 and the second alignment portion 63 of the second circuit layer 6, and is physically and electrically connected to the first pad portion 25a of the first circuit layer 2a. In addition, a first surface (e.g., top surface) of the second conductive structure 17 may contact the first pad portion 25a of the first circuit layer 2a directly. A lateral side surface of the second conductive structure 17 may be physically connected to the second alignment portion 63 of the second circuit layer 6.

In some embodiments, the second conductive structure 17 may be aligned with the first conductive structure 15a. That is, the second conductive structure 17 may be disposed right under the first conductive structure 15a. Thus, the second conductive structure 17 may be physically and electrically connected to the first conductive structure 15a. In some embodiments, the second conductive structure 17 and the first conductive structure 15a may be formed integrally as a monolithic structure or a one-piece structure.

The protection layer 18 (e.g., solder mask) may be disposed on a second surface (e.g., bottom surface) of the second dielectric layer 16 and a second surface (e.g., bottom surface) of the second circuit layer 6. As shown in FIG. 7, the protection layer 18 defines at least one opening 183 to expose a portion of the second alignment portion 63 of the second circuit layer 6 and/or a portion of the second conductive structure 17. The external connector 4 (e.g., solder ball or solder bump) may be disposed in the opening 183 of the protection layer 18 and on the exposed portion of the second alignment portion 63 of the second circuit layer 6 and/or the exposed portion of the second conductive structure 17.

Figure 8:
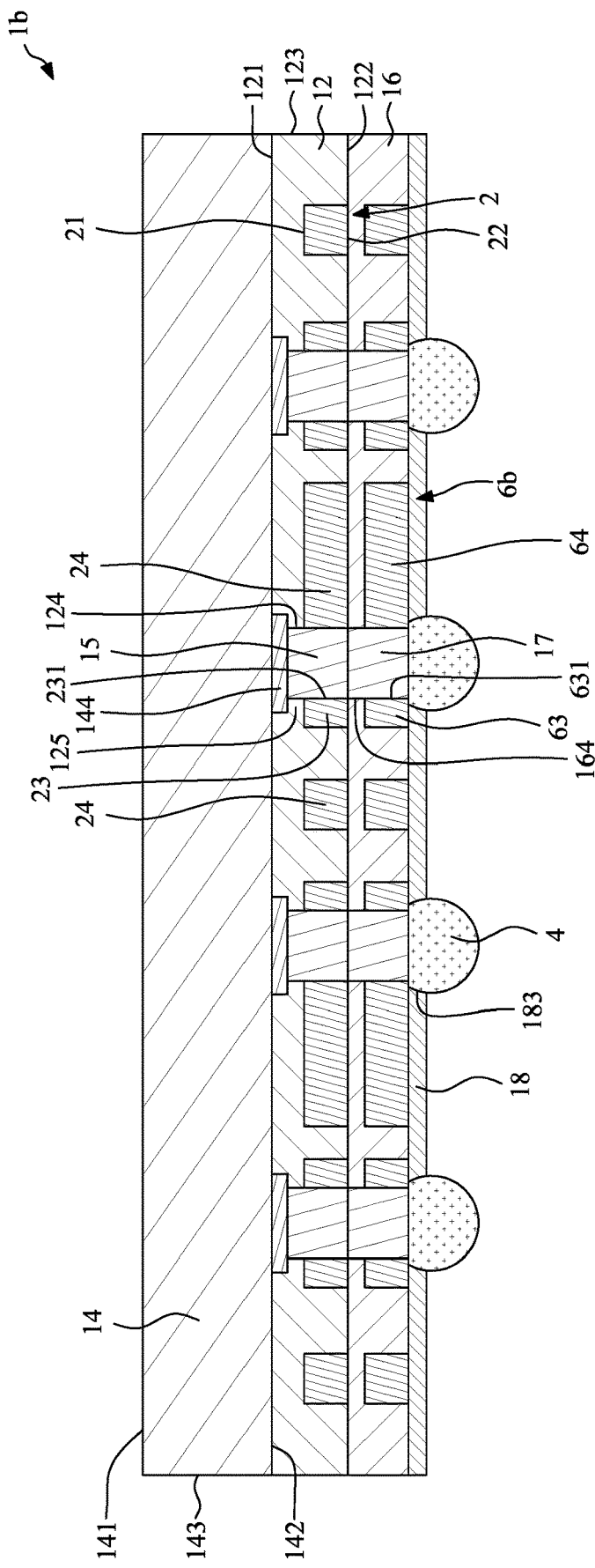
FIG. 8 illustrates a cross-sectional view of a package structure according to some embodiments of the present disclosure.

FIG. 8 illustrates a cross-sectional view of a package structure 1b according to some embodiments of the present disclosure. The package structure 1b of FIG. 8 is similar to the package structure 1a of FIG. 7, except for structures of the first circuit layer 2 and the second circuit layer 6b. In some embodiments, the first circuit layer 2 of FIG. 8 may be same as the circuit layer 2 of FIG. 1, and the second circuit layer 6b of FIG. 8 may be same as the first circuit layer 2 of FIG. 8. In addition, the second conductive structure 17 of the second circuit layer 6b may be aligned with the first conductive structure 15 of the first circuit layer 2. The second conductive structure 17 of the second circuit layer 6b may contact and electrically connect to first conductive structure 15 of the first circuit layer 2.

Figure 9:
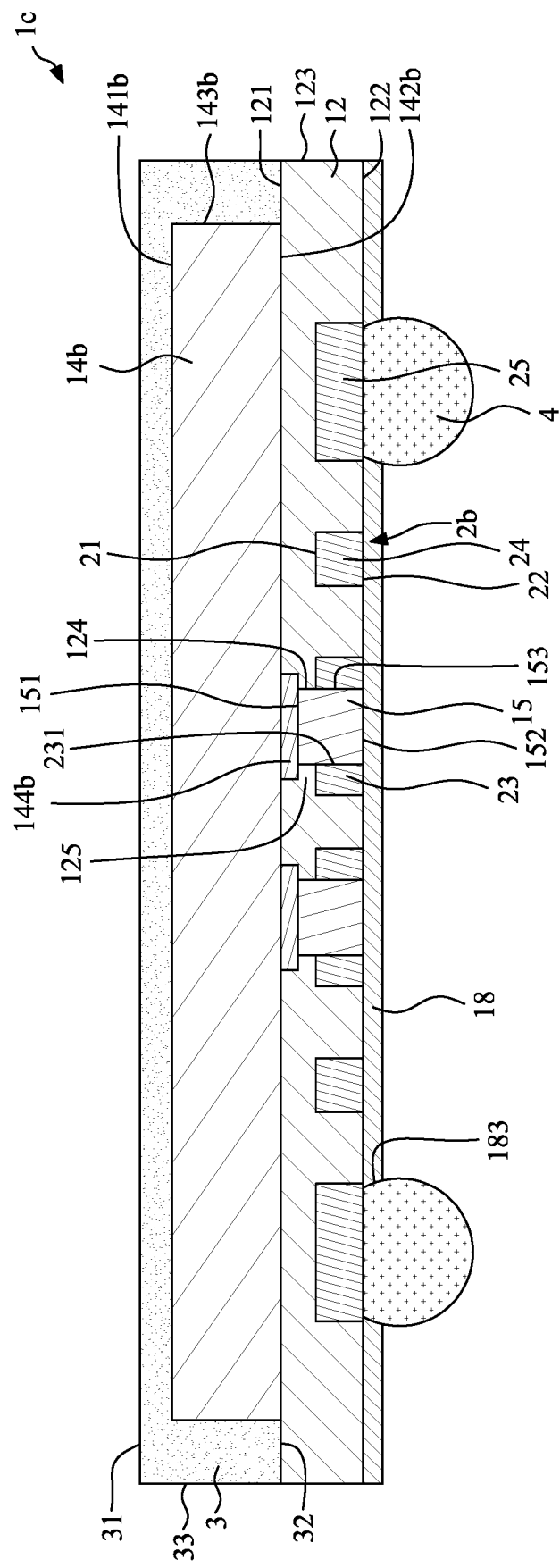
FIG. 9 illustrates a cross-sectional view of a package structure according to some embodiments of the present disclosure.

FIG. 9 illustrates a cross-sectional view of a package structure 1c according to some embodiments of the present disclosure. The package structure 1c of FIG. 9 is similar to the package structure 1 of FIG. 1, except for structures of the circuit layer 2b and the electrical device 14b. Further, the package structure 1c of FIG. 9 may further include an encapsulant 3. As shown in FIG. 9, the circuit layer 2b may be a fan-in circuit layer. That is, the circuit layer 2b may be disposed within a projection area of the electrical device 14b. In some embodiments, the circuit layer 2b may include the alignment portion 23, the trace portion 24 and a pad portion 25. The trace portion 24 is electrically connected to the alignment portion 23. The pad portion 25 is electrically connected to the trace portion 24. Thus, the pad portion 25 may be electrically connected to the alignment portion 23 through the trace portion 24. In addition, the external connector 4 (e.g., solder ball or solder bump) may be disposed on a bottom surface of the pad portion 25 of the circuit layer 2b.

The electrical device 14b may be similar to the electrical device 14 of FIG. 1, and may have a first surface 141b (e.g., top surface), a second surface 142b (e.g., bottom surface) opposite to the first surface 141b (e.g., top surface), and a lateral side surface 143b extending between the first surface 141b (e.g., top surface) and the second surface 142b (e.g., bottom surface). The electrical device 14b may include at least one electrical contact 144b (e.g., connecting pad or bonding pad such as die pad or chip pad) protruding from the second surface 142b (e.g., bottom surface). As shown in FIG. 9, the lateral side surface 143b of the electrical device 14b is recessed from the lateral side surface 123 of the dielectric layer 12. Thus, the lateral side surface 143b of the electrical device 14b is not coplanar with the lateral side surface 123 of the dielectric layer 12. In some embodiments, an area occupied by the circuit layer 2b may be less than a size of the electrical device 14b from a top view.

The encapsulant 3 (e.g., a molding compound) may cover the electrical device 14b and the dielectric layer 12. The encapsulant 3 may have a first surface 31 (e.g., top surface), a second surface 32 (e.g., bottom surface) opposite to the first surface 31 (e.g., top surface), and a lateral side surface 33 extending between the first surface 31 (e.g., top surface) and the second surface 32 (e.g., bottom surface). The second surface 32 of the encapsulant 3 may contact the first surface 121 of the dielectric layer 12. The lateral side surface 33 of the encapsulant 3 may be substantially coplanar with the lateral side surface 123 of the dielectric layer 12.

Figure 10:
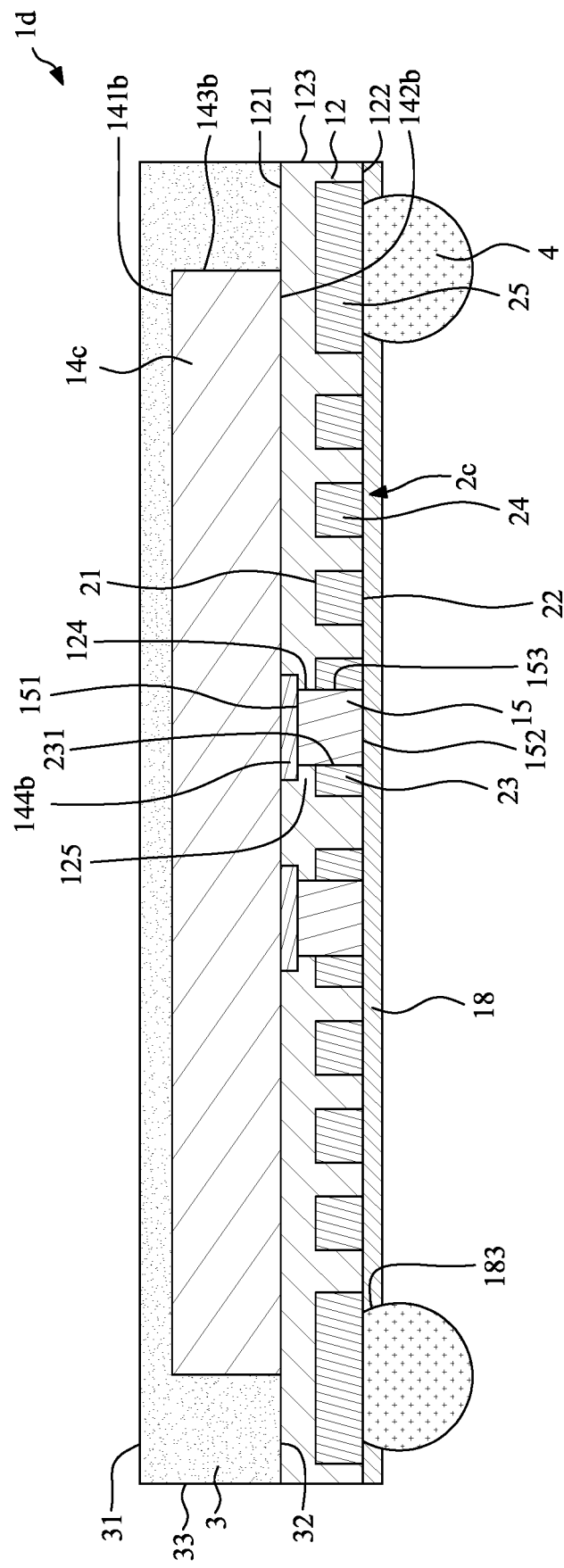
FIG. 10 illustrates a cross-sectional view of a package structure according to some embodiments of the present disclosure.

FIG. 10 illustrates a cross-sectional view of a package structure 1d according to some embodiments of the present disclosure. The package structure 1d of FIG. 10 is similar to the package structure 1c of FIG. 9, except for structures of the circuit layer 2c and the electrical device 14c. As shown in FIG. 10, the circuit layer 2c may be a fan-out circuit layer. That is, the circuit layer 2c may extend to outside a projection area of the electrical device 14c. In some embodiments, the circuit layer 2c may include the alignment portion 23, the trace portion 24 and the pad portion 25. The pad portion 25 may be electrically connected to the alignment portion 23 through the trace portion 24. At least a portion of the pad portion 25 may be disposed outside the projection area of the electrical device 14c. The electrical device 14c may be similar to the electrical device 14b of FIG. 9. In some embodiments, an area occupied by the circuit layer 2c may be greater than a size of the electrical device 14c from a top view.

Figure 11:
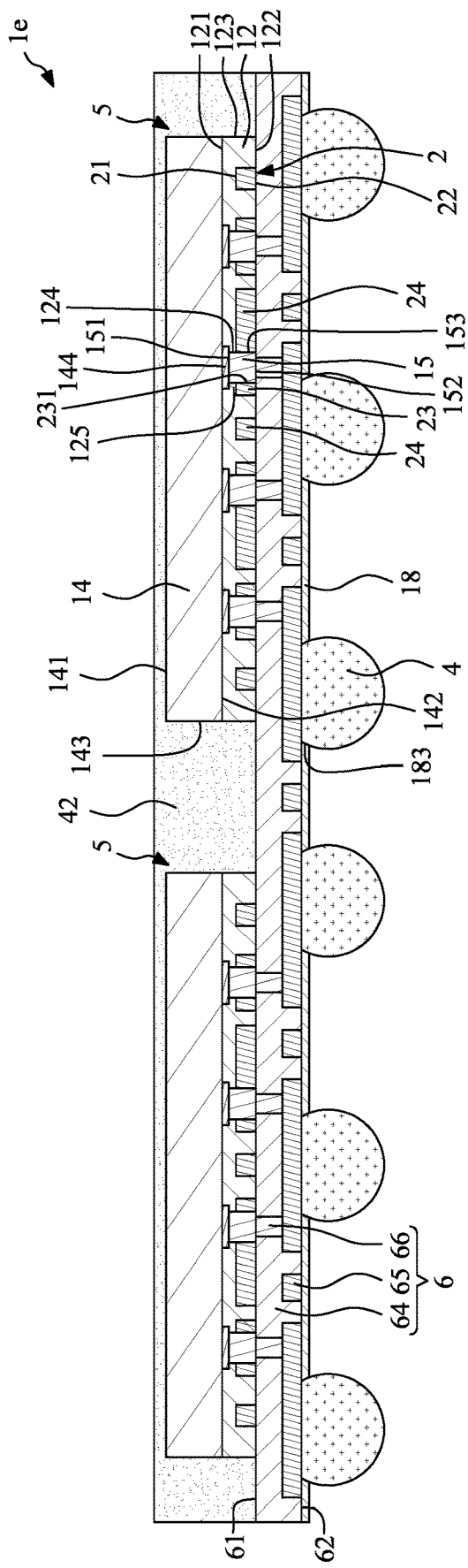
FIG. 11 illustrates a cross-sectional view of a package structure according to some embodiments of the present disclosure.

FIG. 11 illustrates a cross-sectional view of a package structure 1e according to some embodiments of the present disclosure. The package structure 1e may include a plurality of assembly structures 5, a redistribution structure 6, a package body 42, a protection layer 18 and at least one external connector 4. Each of the assembly structures 5 is similar to the package structure 1 of FIG. 1, except that each of the assembly structures 5 may not include the protection layer 18 and the external connector 4. Thus, each of the assembly structures 5 may include the circuit layer 2, the dielectric layer 12, the electrical device 14 and the conductive structure 15. The assembly structures 5 are disposed on the redistribution structure 6 side by side. The circuit layer 2 and/or the conductive structure 15 of the assembly structure 5 aligns with and is electrically connected to the redistribution structure 6.

The redistribution structure 6 may have a first surface 61 (e.g., top surface) and a second surface 62 (e.g., bottom surface) opposite to the first surface 61 (e.g., top surface). The redistribution structure 6 may include a dielectric structure 64, at least one redistribution layer 65 and at least one conductive via 66. The redistribution layer 65 and the conductive via 66 are embedded in the dielectric structure 64. The second surface 122 (e.g., bottom surface) of the dielectric layer 12 of the assembly structure 5 may be disposed adjacent to or disposed on the first surface 61 of the redistribution structure 6. The circuit layer 2 and/or the conductive structure 15 of the assembly structure 5 may be electrically connected to the redistribution layer 65 through the conductive via 66.

The package body 42 (e.g., molding compound) may be disposed on the first surface 61 of the redistribution structure 6 to cover the assembly structures 5. The protection layer 18 (e.g., solder mask) is disposed on the second surface 62 (e.g., bottom surface) of the redistribution structure 6 and the bottom surface of the redistribution layer 65. In some embodiments, the protection layer 18 defines at least one opening 183 to expose a portion of the redistribution layer 65. The external connector 4 (e.g., solder ball or solder bump) may be disposed in the opening 183 of the protection layer 18 and on the exposed portion of the redistribution layer 65.

Figure 12:
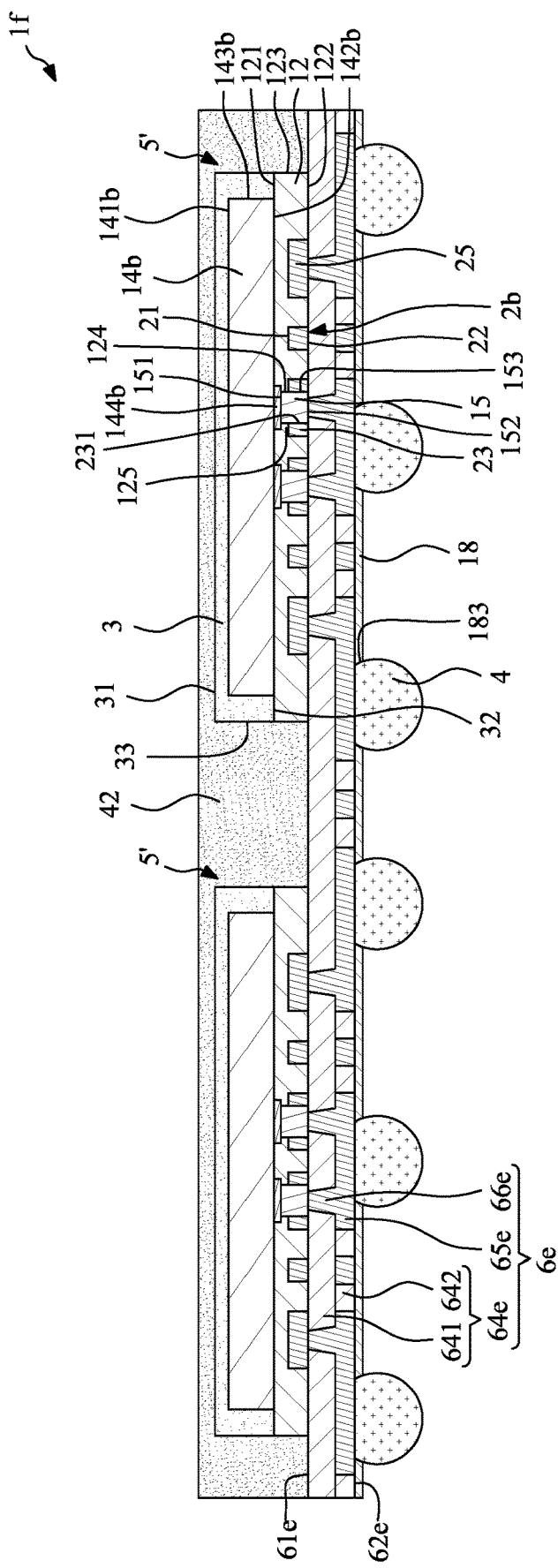
FIG. 12 illustrates a cross-sectional view of a package structure according to some embodiments of the present disclosure.

FIG. 12 illustrates a cross-sectional view of a package structure 1f according to some embodiments of the present disclosure. The package structure 1f may include a plurality of assembly structures 5', a redistribution structure 6e, a package body 42, a protection layer 18 and at least one external connector 4. Each of the assembly structures 5' is similar to the package structure 1c of FIG. 9, except that each of the assembly structures 5' may not include the protection layer 18 and the external connector 4. Thus, each of the assembly structures 5' may include the circuit layer 2b, the dielectric layer 12, the electrical device 14, the conductive structure 15 and the encapsulant 3. The assembly structures 5' are disposed on the redistribution structure 6e side by side. The circuit layer 2b and/or the conductive structure 15 of the assembly structure 5' aligns with and is electrically connected to the redistribution structure 6e.

The redistribution structure 6e may have a first surface 61e (e.g., top surface) and a second surface 62e (e.g., bottom surface) opposite to the first surface 61e (e.g., top surface). The redistribution structure 6e may include a dielectric structure 64e, at least one redistribution layer 65e and at least one conductive via 66e. The redistribution layer 65e and the conductive via 66e are embedded in the dielectric structure 64e. For example, the dielectric structure 64e may include a first dielectric layer 641 and a second dielectric layer 642. The redistribution layer 65e and the conductive via 66e may be disposed on the first dielectric layer 641, and may be formed concurrently. The second dielectric layer 642 may be disposed on the first dielectric layer 641. In addition, the second surface 122 (e.g., bottom surface) of the dielectric layer 12 of the assembly structure 5' may be disposed adjacent to or disposed on the first surface 61e of the redistribution structure 6e. The circuit layer 2b and/or the conductive structure 15 of the assembly structure 5' may be electrically connected to the redistribution layer 65e through the conductive via 66e.

The package body 42 (e.g., molding compound) may be disposed on the first surface 61e of the redistribution structure 6e to cover the assembly structures 5'. The protection layer 18 (e.g., solder mask) is disposed on the second surface 62e (e.g., bottom surface) of the redistribution structure 6e and the bottom surface of the redistribution layer 65e. In some embodiments, the protection layer 18 defines at least one opening 183 to expose a portion of the redistribution layer 65e. The external connector 4 (e.g., solder ball or solder bump) may be disposed in the opening 183 of the protection layer 18 and on the exposed portion of the redistribution layer 65e.

FIG. 13 through FIG. 19 illustrate a method for manufacturing a package structure according to some embodiments of the present disclosure. In some embodiments, the method is for manufacturing the package structure 1c shown in FIG. 9, and the package structure 1d shown in FIG. 10.

Figure 13:
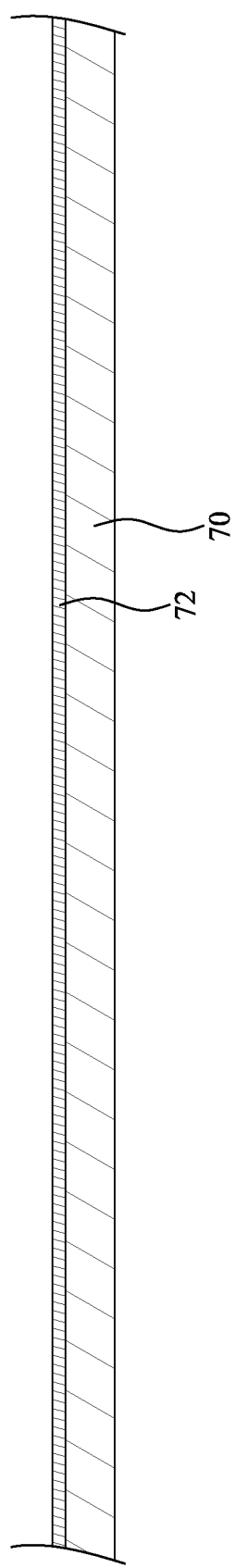
FIG. 13 illustrates one or more stages of an example of a method for manufacturing a package structure according to some embodiments of the present disclosure.

Referring to FIG. 13, a carrier 70 is provided. A seed layer 72 is formed or disposed on the carrier 70.

Figure 14:
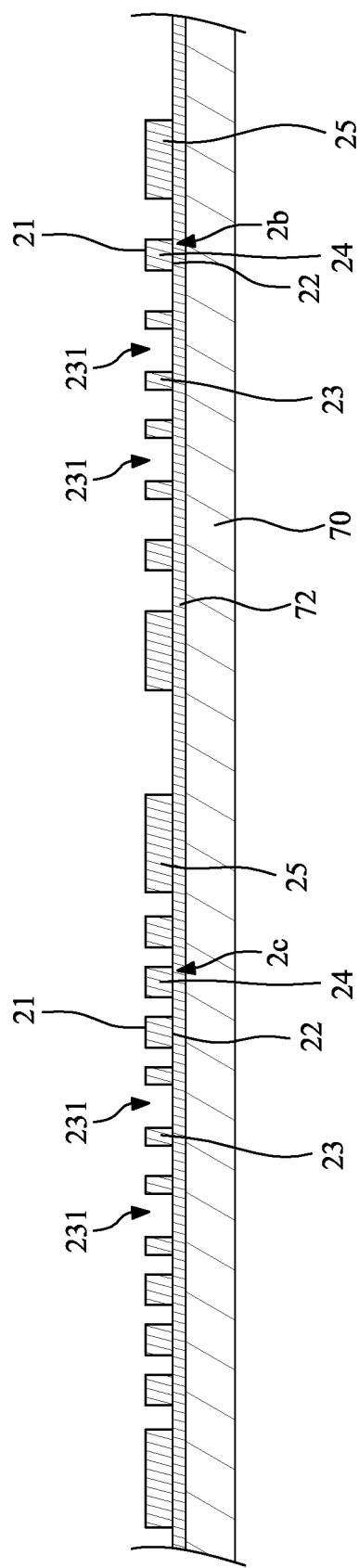
FIG. 14 illustrates one or more stages of an example of a method for manufacturing a package structure according to some embodiments of the present disclosure.

Referring to FIG. 14, a circuit layer 2b and a circuit layer 2c are formed or disposed on the seed layer 72 on the carrier 70. The circuit layer 2b and the circuit layer 2c of FIG. 14 may be similar to the circuit layer 2b of FIG. 9 and the circuit layer 2c of FIG. 10, respectively. The circuit layer 2b and the circuit layer 2c may include an alignment portion 23, a trace portion 24 and a pad portion 25. The trace portion 24 is electrically connected to the alignment portion 23. The pad portion 25 is electrically connected to the trace portion 24. Thus, the pad portion 25 may be electrically connected to the alignment portion 23 through the trace portion 24. The alignment portion 23 may define a through hole 231 extending through the alignment portion 23.

Figure 15:
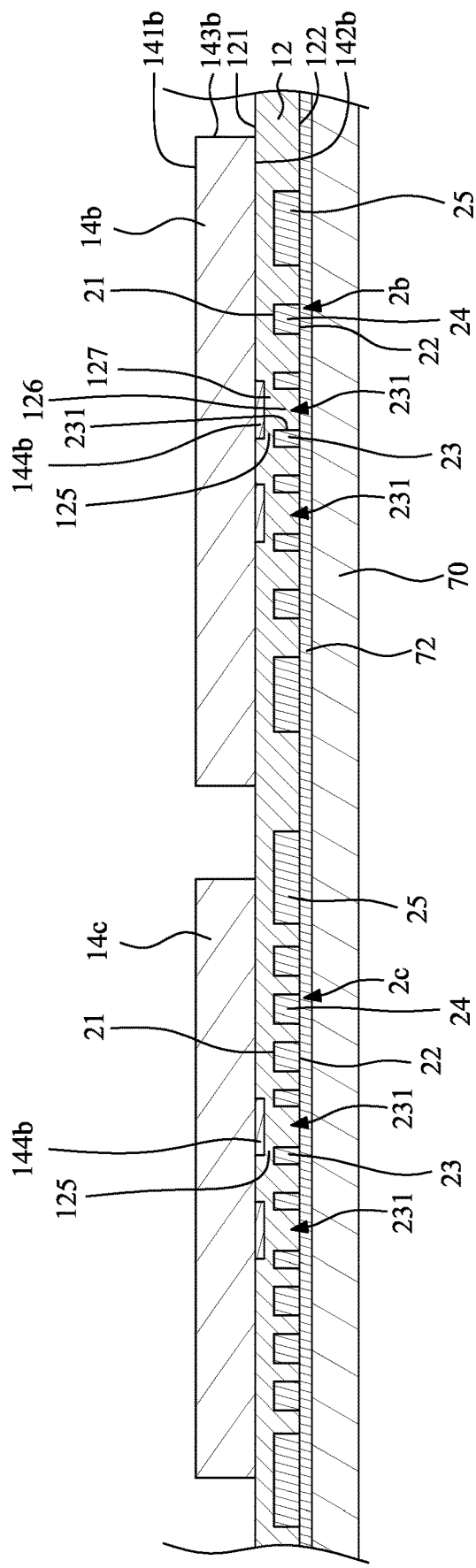
FIG. 15 illustrates one or more stages of an example of a method for manufacturing a package structure according to some embodiments of the present disclosure.

Referring to FIG. 15, a dielectric layer 12 may be formed or disposed on the seed layer 72 on the carrier 70 to cover the circuit layers 2b, 2c. The dielectric layer 12 may have a first surface 121 (e.g., top surface) and a second surface 122 (e.g., bottom surface) opposite to the first surface 121 (e.g., top surface). The first surface 121 (e.g., top surface) of the dielectric layer 12 may be higher than a first surface 21 (e.g., top surface) of the circuit layers 2b, 2c.

Then, an electrical device 14b and an electrical device 14c may be attached on the dielectric layer 12. The electrical device 14b corresponds to the circuit layers 2b, and an area occupied by the circuit layer 2b may be less than a size of the electrical device 14b from a top view. The electrical device 14c corresponds to the circuit layers 2c, and an area occupied by the circuit layer 2c may be greater than a size of the electrical device 14c from a top view.

Each of the electrical devices 14b, 14c may be a semiconductor die or semiconductor chip, and may have a first surface 141b (e.g., top surface) and a second surface 142b (e.g., bottom surface) opposite to the first surface 141b (e.g., top surface). Each of the electrical devices 14b, 14c may include at least one electrical contact 144b aligning with the through holes 231 of the alignment portions 23 of the circuit layers 2b, 2c. As shown in FIG. 15, the electrical contacts 144b or the second surfaces 142b (e.g., bottom surface) of the electrical devices 14b, 14c may not contact the first surface 21 (e.g., top surface) of the circuit layers 2b, 2c. Thus, a portion 125 of the dielectric layer 12 may be interposed between the alignment portions 23 of the circuit layers 2b, 2c and the electrical contacts 144b or the second surfaces 142b (e.g., bottom surface) of the electrical devices 14b, 14c. In addition, as shown in FIG. 15, a first portion 126 of the dielectric layer 12 may be disposed in and fill the through hole 231 of the alignment portion 23, and a second portion 127 of the dielectric layer 12 may be disposed between the electrical contact 144b of the electrical devices 14b, 14c and the through holes 231 of the alignment portion 23.

Figure 16:
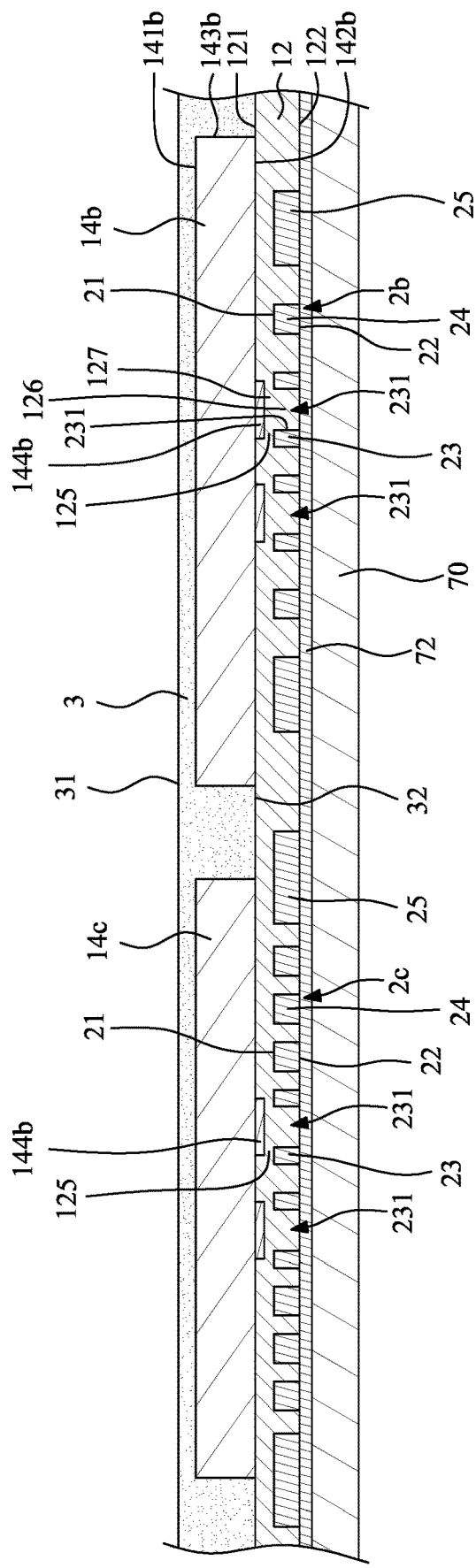
FIG. 16 illustrates one or more stages of an example of a method for manufacturing a package structure according to some embodiments of the present disclosure.

Referring to FIG. 16, an encapsulant 3 (e.g., a molding compound) may be formed or disposed on the first surface 121 of the dielectric layer 12 to cover the electrical devices 14b, 14c and the dielectric layer 12.

Figure 17:
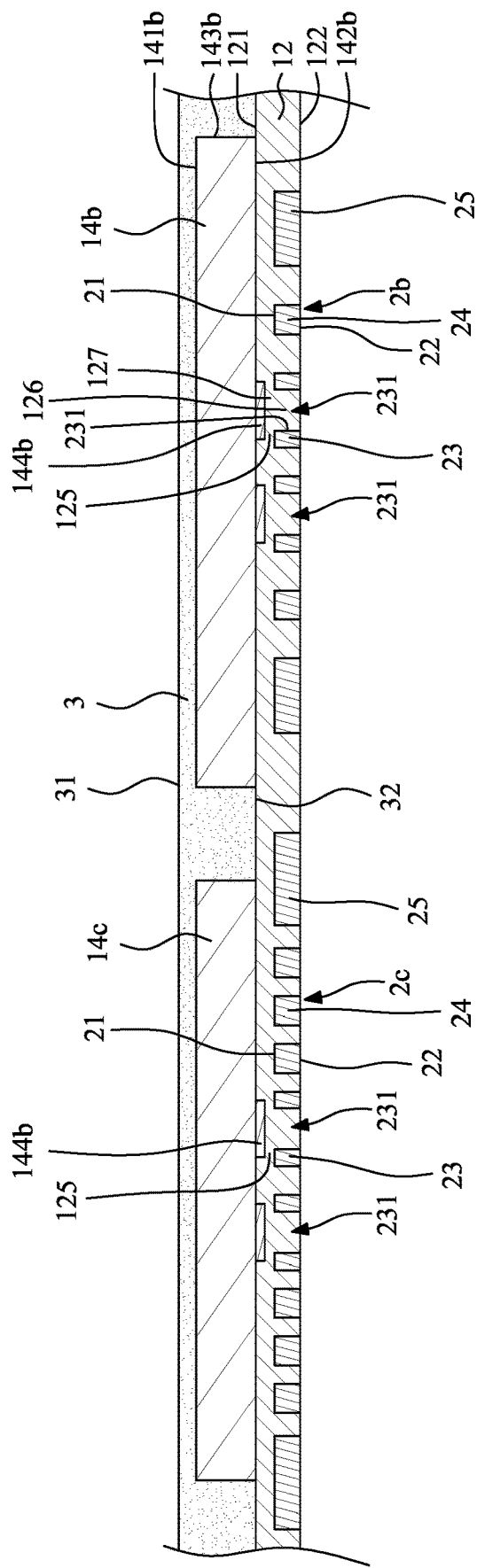
FIG. 17 illustrates one or more stages of an example of a method for manufacturing a package structure according to some embodiments of the present disclosure.

Referring to FIG. 17, the carrier 70 and the seed layer 72 may be removed.

Figure 18:
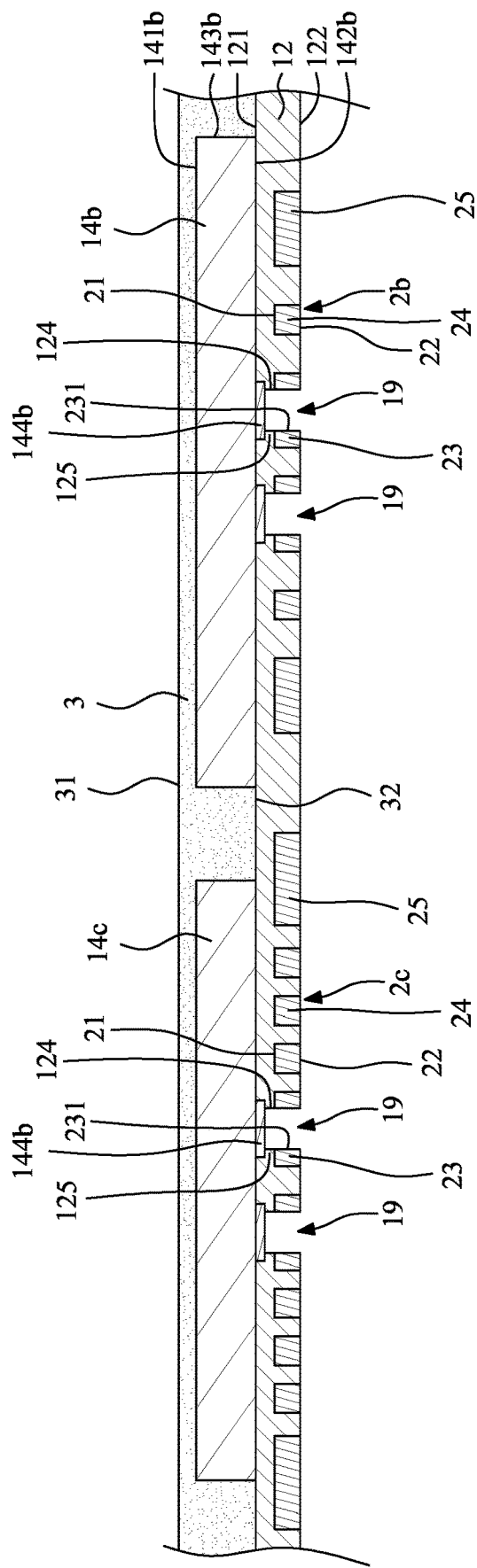
FIG. 18 illustrates one or more stages of an example of a method for manufacturing a package structure according to some embodiments of the present disclosure.

Referring to FIG. 18, the first portion 126 and the second portion 127 of the dielectric layer 12 may be removed by, for example, laser drilling, so as to form or define a cavity 19 to expose the electrical contact 144b of the electrical devices 14b, 14c. The cavity 19 may include the through hole 231 of the alignment portion 23 and a through hole 124 of the dielectric layer 12.

Figure 19:
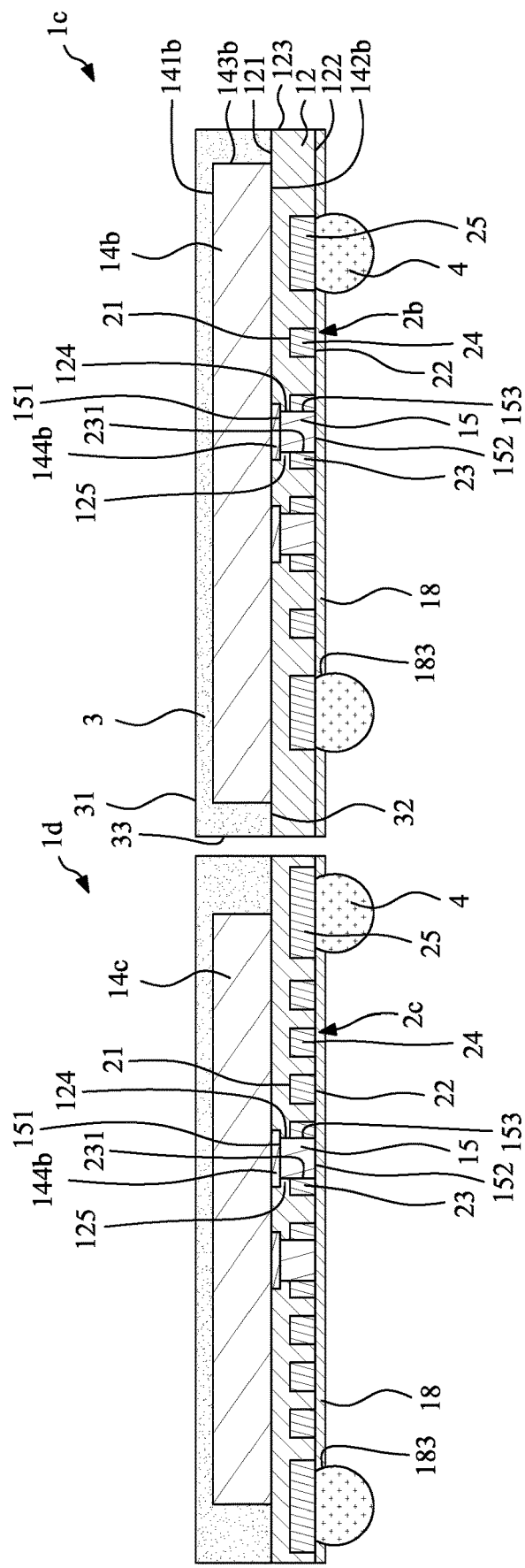
FIG. 19 illustrates one or more stages of an example of a method for manufacturing a package structure according to some embodiments of the present disclosure.

Referring to FIG. 19, a conductive material (e.g., copper paste) may be formed or disposed in the cavity 19 by, for example, plating, so as to form a conductive structure 15.

Thus, the conductive structure 15 may be formed or disposed in the through holes 124 of the dielectric layer 12 and the through holes 231 of the alignment portions 23 of the circuit layers 2b, 2c. Thus, the conductive structures 15 may extend through the dielectric layer 12 and the alignment portions 23 of the circuit layers 2b, 2c, and connects the electrical contact 144b of the electrical devices 14b, 14c. That is, the conductive structure 15 may extend through the through hole 231 of the alignment portions 23.

Then, a protection layer 18 (e.g., solder mask) is formed or disposed on the second surface 122 (e.g., bottom surface) of the dielectric layer 12 and the second surface 22 (e.g., bottom surface) of the circuit layer 2. In some embodiments, the protection layer 18 (e.g., solder mask) covers and contacts the second surface 122 (e.g., bottom surface) of the dielectric layer 12 and the second surfaces 22 (e.g., bottom surfaces) of the circuit layers 2b, 2c. As shown in FIG. 19, the protection layer 18 may define a plurality of openings 183 to expose portions of the alignment portions 23 of the circuit layers 2b, 2c and/or portions (e.g., the second surfaces 152) of the conductive structures 15. Then, a plurality of external connectors 4 (e.g., solder balls or solder bumps) may be formed or disposed in the openings 183 of the protection layer 18 and on the exposed portions of the alignment portions 23 of the circuit layers 2b, 2c and/or the exposed portions of the conductive structures 15.

Then, a singulation process may be conducted so as to obtain the package structure 1c shown in FIG. 9 and the package structure 1d shown in FIG. 10.

FIG. 20 through FIG. 27 illustrate a method for manufacturing a package structure according to some embodiments of the present disclosure. In some embodiments, the method is for manufacturing the package structure 1 shown in FIG. 1, and the package structure 1e shown in FIG. 11.

Figure 20:
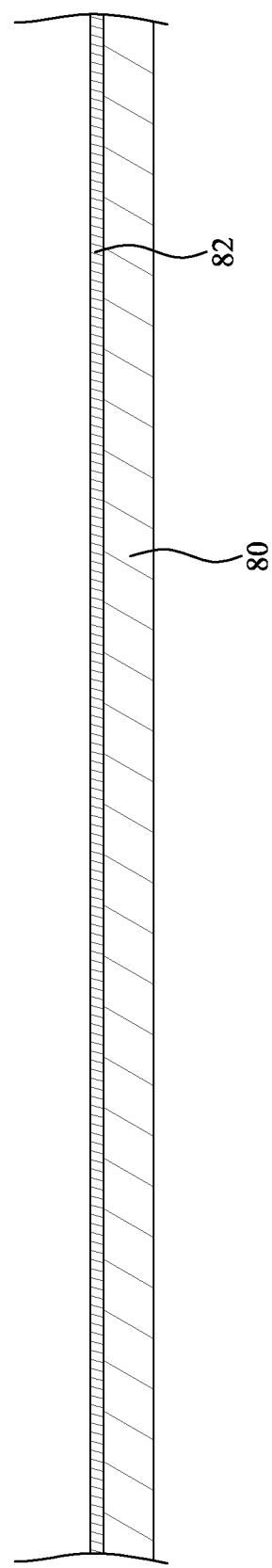
FIG. 20 illustrates one or more stages of an example of a method for manufacturing a package structure according to some embodiments of the present disclosure.

Referring to FIG. 20, a carrier 80 (e.g., a first carrier) is provided. A seed layer 82 is formed or disposed on the carrier 80.

Figure 21:
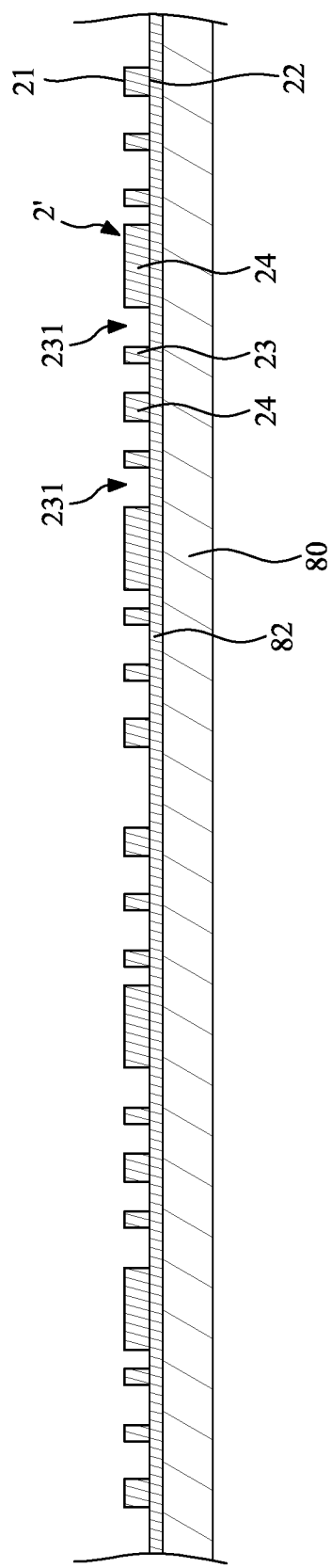
FIG. 21 illustrates one or more stages of an example of a method for manufacturing a package structure according to some embodiments of the present disclosure.

Referring to FIG. 21, a circuit layer 2' (e.g., a first circuit layer) may be formed or disposed on the seed layer 82 on the carrier 80. The circuit layer 2' of FIG. 21 may be similar to the circuit layer 2 of FIG. 1. The circuit layer 2' may include an alignment portion 23 and a trace portion 24. The trace portion 24 is electrically connected to the alignment portion 23. The alignment portion 23 may define a through hole 231 extending through the alignment portion 23.

Figure 22:
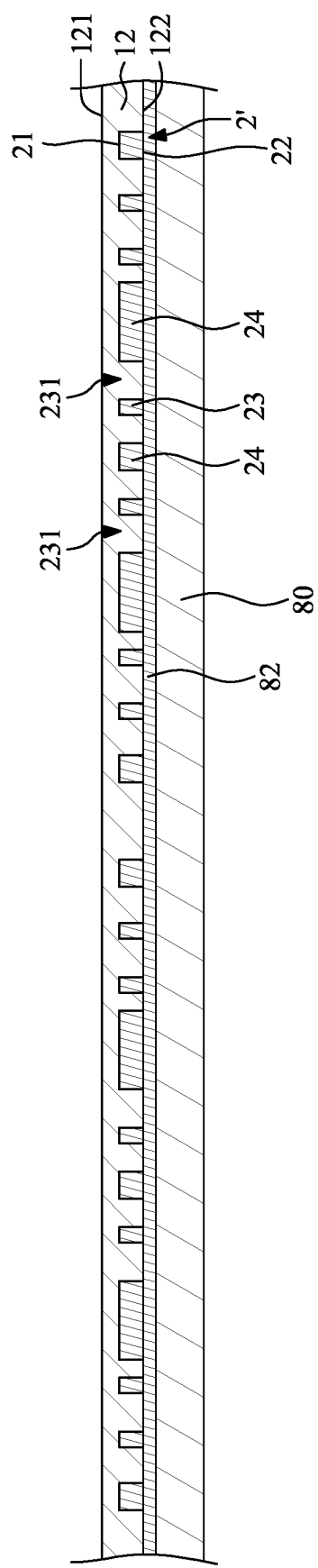
FIG. 22 illustrates one or more stages of an example of a method for manufacturing a package structure according to some embodiments of the present disclosure.

Referring to FIG. 22, a dielectric layer 12 (e.g., a first dielectric layer) may be formed or disposed on the seed layer 82 on the carrier 80 to cover the circuit layer 2'. The dielectric layer 12 may have a first surface 121 (e.g., top surface) and a second surface 122 (e.g., bottom surface) opposite to the first surface 121 (e.g., top surface).

Figure 23:
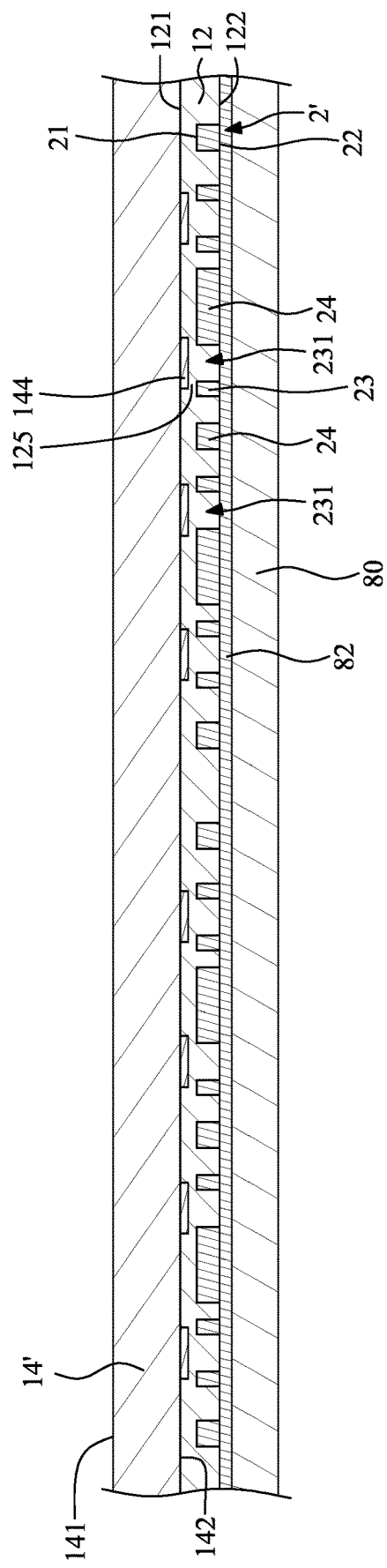
FIG. 23 illustrates one or more stages of an example of a method for manufacturing a package structure according to some embodiments of the present disclosure.

Referring to FIG. 23, an electrical device 14' may be attached on the dielectric layer 12. The electrical device 14' may be a semiconductor wafer, and may have a first surface 141 (e.g., top surface) and a second surface 142 (e.g., bottom surface) opposite to the first surface 141 (e.g., top surface). The electrical device 14' may include a plurality of electrical contacts 144 corresponding to the through holes 231 of the alignment portions 23 of the circuit layer 2'. As shown in FIG. 23, the electrical contacts 144 or the second surface 142 (e.g., bottom surface) of the electrical device 14' may not contact the first surface 21 (e.g., top surface) of the circuit layer 2'. Thus, a portion 125 of the dielectric layer 12 may be interposed between the alignment portion 23 of the circuit layer 2' and the electrical contact 144 or the second surface 142 (e.g., bottom surface) of the electrical device 14'.

Figure 24:
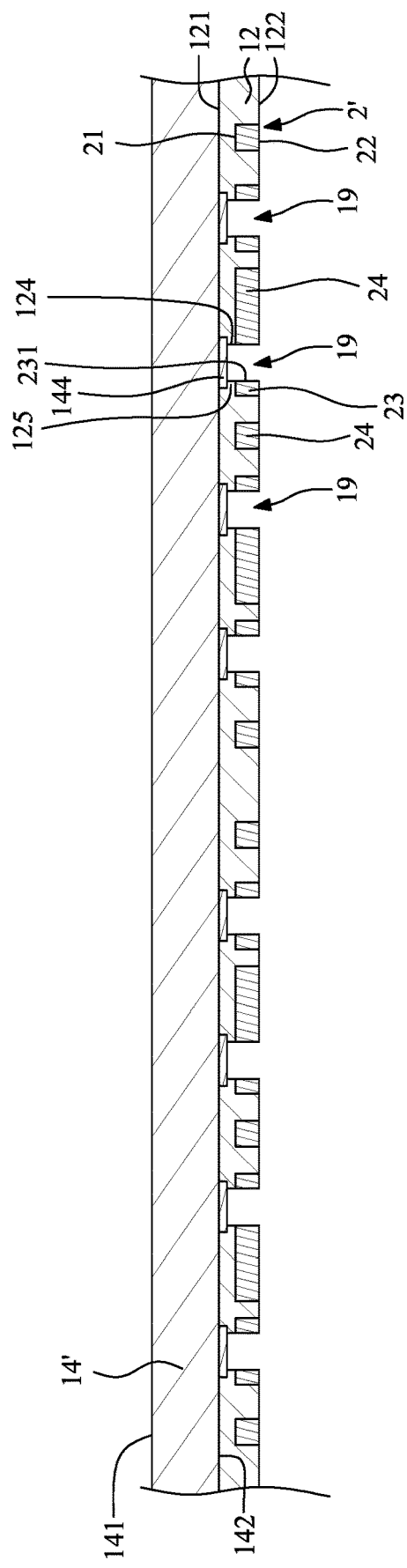
FIG. 24 illustrates one or more stages of an example of a method for manufacturing a package structure according to some embodiments of the present disclosure.

Referring to FIG. 24, the carrier 80 and the seed layer 82 may be removed. Then, a portion (e.g., the first portion 126 and the second portion 127 of FIG. 17) of the dielectric layer 12 may be removed by, for example, laser drilling, so as to form or define a cavity 19 to expose the electrical contact 144 of the electrical device 14'. The cavity 19 may include the through hole 231 of the alignment portion 23 and a through hole 124 of the dielectric layer 12.

Then, a conductive material (e.g., copper paste) may be formed or disposed in the cavity 19 by, for example, plating, so as to form a conductive structure 15 (e.g., a first conductive structure). Thus, the conductive structure 15 may be formed or disposed in the through hole 124 of the dielectric layer 12 and the through hole 231 of the alignment portion 23 of the circuit layer 2'. Thus, the conductive structures 15 may extend through the dielectric layer 12 and the alignment portion 23 of the circuit layer 2', and connects the electrical contact 144 of the electrical device 14'.

In some embodiments, a protection layer 18 (e.g., solder mask) may be formed or disposed on the second surface 122 of the dielectric layer 12 and the second surface 22 of the circuit layer 2'. Further, the protection layer 18 may define a plurality of openings 183 to expose portions of the alignment portion 23 of the circuit layer 2' and/or a portion (e.g., the second surface 152) of the conductive structure 15. Then, a plurality of external connectors 4 (e.g., solder balls or solder bumps) may be formed or disposed in the openings 183 of the protection layer 18 and on the exposed portions of the alignment portion 23 of the circuit layer 2' and/or the exposed portions of the conductive structure 15. Then, a singulation process may be conducted so as to obtain a plurality of package structures 1 shown in FIG. 1.

Figure 25:
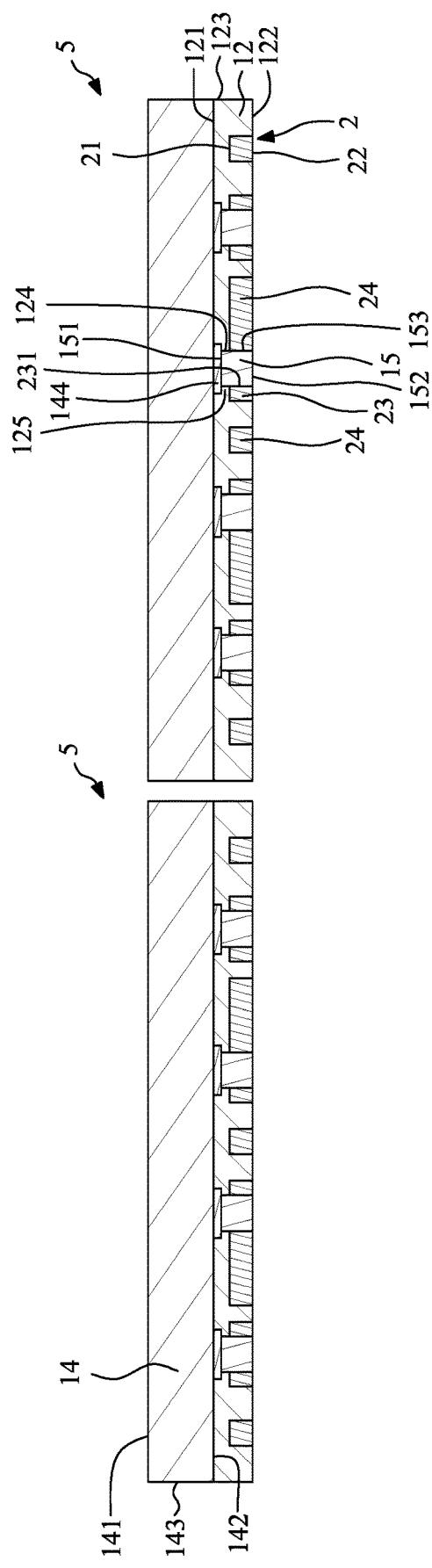
FIG. 25 illustrates one or more stages of an example of a method for manufacturing a package structure according to some embodiments of the present disclosure.

Referring to FIG. 25, before the protection layer 18 is formed, a singulation process may be conducted so as to obtain a plurality of assembly structures 5 shown in FIG. 11.

Figure 26:
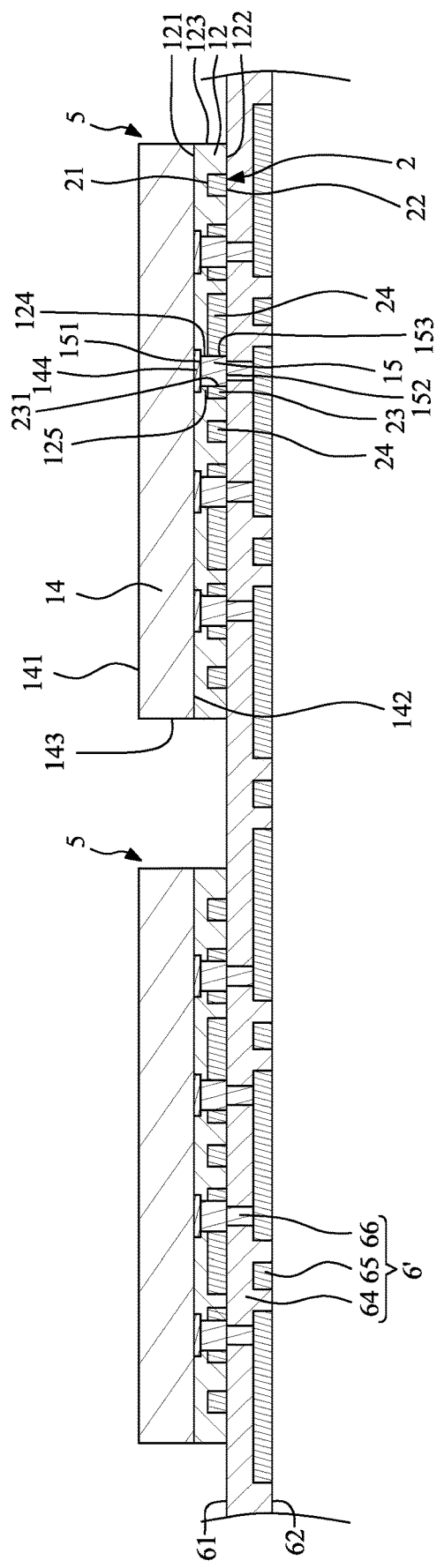
FIG. 26 illustrates one or more stages of an example of a method for manufacturing a package structure according to some embodiments of the present disclosure.

Referring to FIG. 26, the assembly structures 5 are disposed on a redistribution structure 6 side by side. The circuit layer 2 and/or the conductive structure 15 of the assembly structure 5 is electrically connected to the redistribution structure 6. The redistribution structure 6 may have a first surface 61 (e.g., top surface) and a second surface 62 (e.g., bottom surface) opposite to the first surface 61 (e.g., top surface). The redistribution structure 6 may include a dielectric structure 64, at least one redistribution layer 65 and at least one conductive via 66. The redistribution layer 65 and the conductive via 66 are embedded in the dielectric structure 64. The second surface 122 (e.g., bottom surface) of the dielectric layer 12 of the assembly structure 5 may be disposed adjacent to or disposed on the first surface 61 of the redistribution structure 6. The circuit layer 2 and/or the conductive structure 15 of the assembly structure 5 may be electrically connected to the redistribution layer 65 through the conductive via 66.

Figure 27:
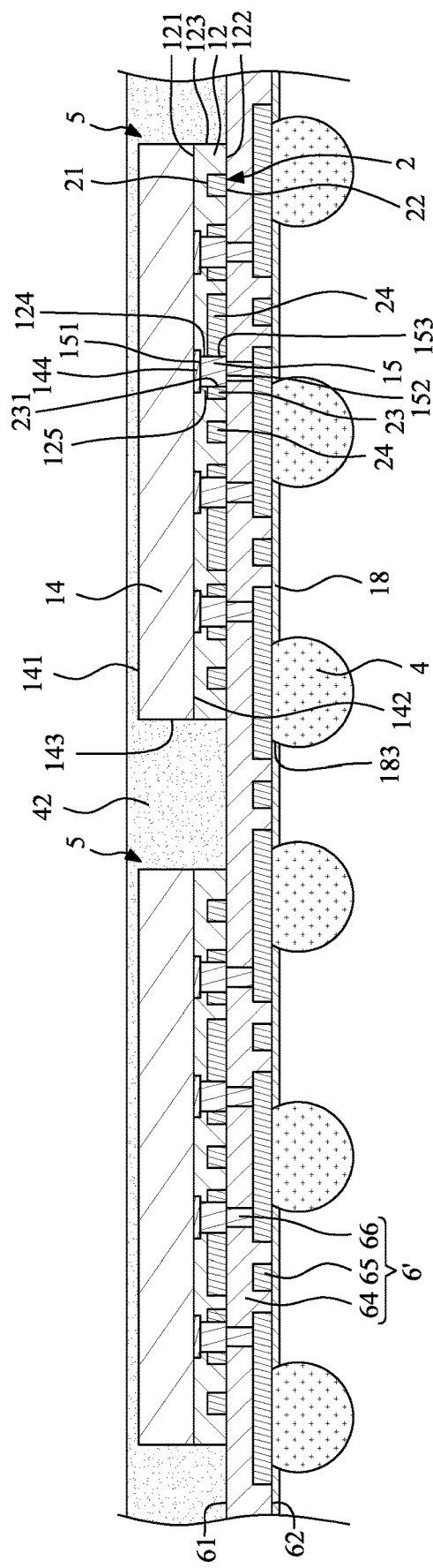
FIG. 27 illustrates one or more stages of an example of a method for manufacturing a package structure according to some embodiments of the present disclosure.

Referring to FIG. 27, a package body 42 (e.g., molding compound) may be formed or disposed on the first surface 61 of the redistribution structure 6 to cover the assembly structures 5. Then, a protection layer 18 (e.g., solder mask) is formed or disposed on the second surface 62 (e.g., bottom surface) of the redistribution structure 6 and the bottom surface of the redistribution layer 65. In some embodiments, the protection layer 18 defines at least one opening 183 to expose a portion of the redistribution layer 65. The external connector 4 (e.g., solder ball or solder bump) may be disposed in the opening 183 of the protection layer 18 and on the exposed portion of the redistribution layer 65.

Then, a singulation process may be conducted so as to obtain the package structure 1e shown in FIG. 11.

Figure 28:
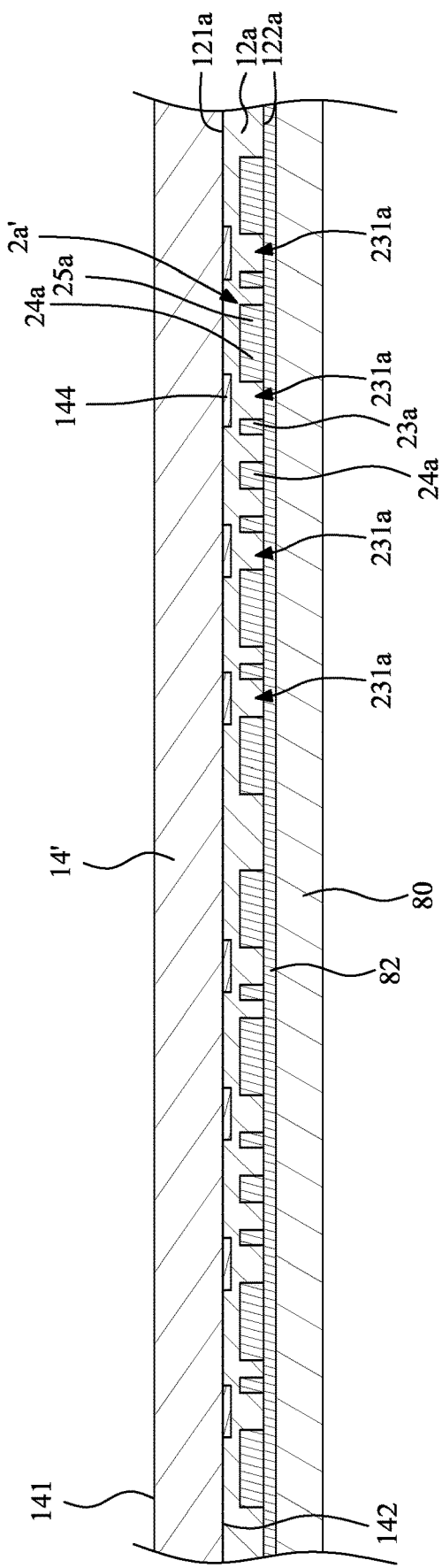
FIG. 28 illustrates one or more stages of an example of a method for manufacturing a package structure according to some embodiments of the present disclosure.

FIG. 28 through FIG. 34 illustrate a method for manufacturing a package structure according to some embodiments of the present disclosure. In some embodiments, the method is for manufacturing the package structure 1a shown in FIG. 7. The initial stages of the illustrated process are the same as, or similar to, the stages illustrated in FIG. 20 to FIG. 23. FIG. 28 depicts a stage similar to that depicted in FIG. 23.

Referring to FIG. 28, a first circuit layer 2a' may be formed or disposed on the seed layer 82 on the first carrier 80. The first circuit layer 2a' of FIG. 28 may be similar to the circuit layer 2a of FIG. 7. The first circuit layer 2a' may include a first alignment portion 23a, a first trace portion 24a and a first pad portion 25a. The first alignment portion 23a may define a through hole 231a extending through the first circuit layer 2a. The first pad portion 25a may be electrically connected to the first alignment portion 23a through the first trace portion 24a.

Then, a first dielectric layer 12a may be formed or disposed on the seed layer 82 on the first carrier 80 to cover the first circuit layer 2a'. The first dielectric layer 12a may cover the first circuit layer 2a'. The first dielectric layer 12a may have a first surface 121a (e.g., top surface) and a second surface 122a (e.g., bottom surface) opposite to the first surface 121a (e.g., top surface).

Then, an electrical device 14' may be attached on the first dielectric layer 12a. The electrical device 14' may have a first surface 141 (e.g., top surface) and a second surface 142 (e.g., bottom surface) opposite to the first surface 141 (e.g., top surface). The electrical device 14' may include a plurality of electrical contacts 144 corresponding to the through holes 231a of the first alignment portion 23 of the first circuit layer 2a'. As shown in FIG. 28, the electrical contacts 144 or the second surface 142 (e.g., bottom surface) of the electrical device 14' may not contact the first circuit layer 2a'.

Figure 29:
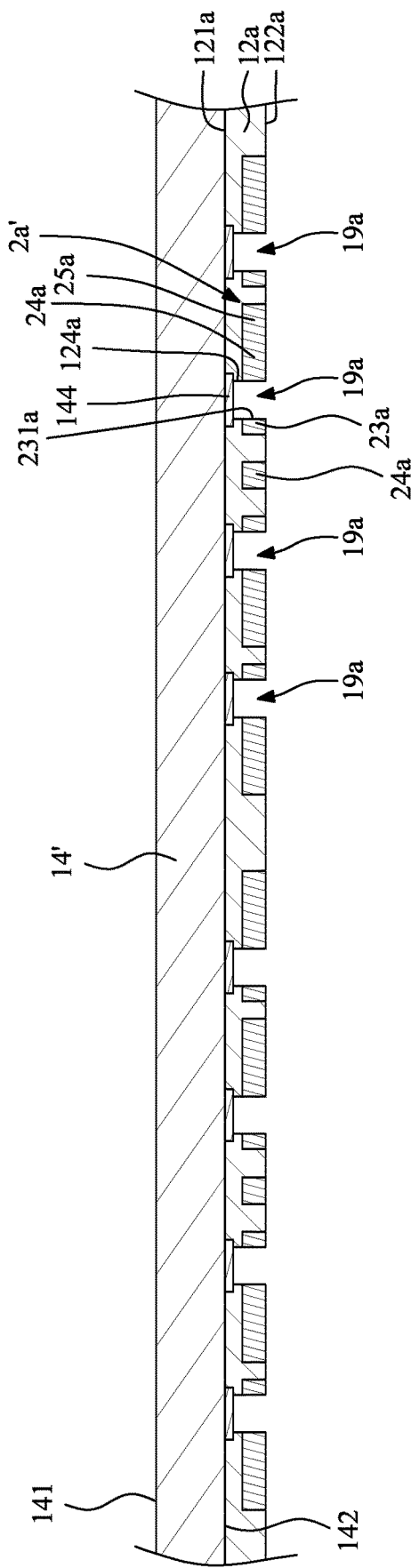
FIG. 29 illustrates one or more stages of an example of a method for manufacturing a package structure according to some embodiments of the present disclosure.

Referring to FIG. 29, the first carrier 80 and the seed layer 82 may be removed. Then, a portion (e.g., the first portion 126 and the second portion 127 of FIG. 17) of the first dielectric layer 12a may be removed by, for example, laser drilling, so as to form or define a cavity 19a to expose the electrical contact 144 of the electrical device 14'. The cavity 19a may include the through hole 231a of the first alignment portion 23a and a through hole 124a of the first dielectric layer 12a.

Figure 30:
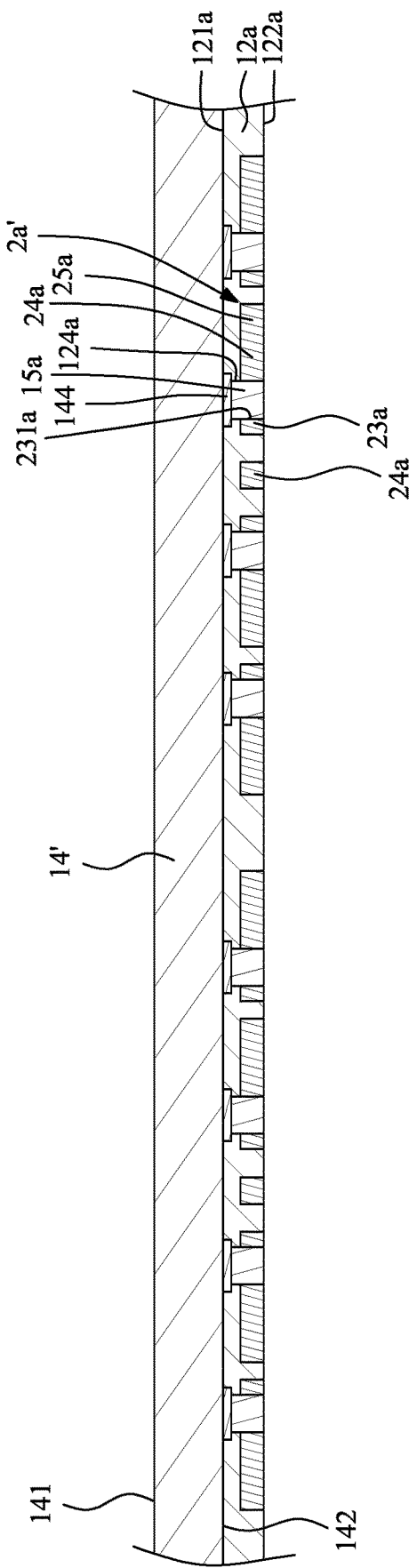
FIG. 30 illustrates one or more stages of an example of a method for manufacturing a package structure according to some embodiments of the present disclosure.

Referring to FIG. 30, a conductive material (e.g., copper paste) may be formed or disposed in the cavity 19a by, for example, plating, so as to form a first conductive structure 15a. Thus, the first conductive structure 15a may be formed or disposed in the through hole 124a of the first dielectric layer 12a and the through hole 231a of the first alignment portion 23a of the first circuit layer 2a'. Thus, the first conductive structures 15a may extend through the first dielectric layer 12a and the first alignment portion 23a of the first circuit layer 2a', and connects the electrical contact 144 of the electrical device 14'.

Figure 31:
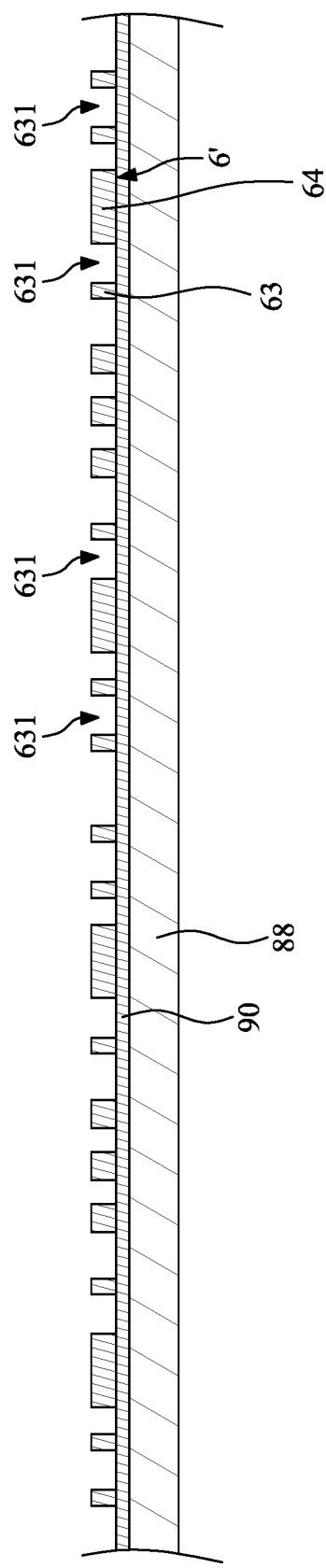
FIG. 31 illustrates one or more stages of an example of a method for manufacturing a package structure according to some embodiments of the present disclosure.

Referring to FIG. 31, a second carrier 88 with a seed layer 90 is provided. Then, a second circuit layer 6' may be formed or disposed on the seed layer 90 on the second carrier 88. The second circuit layer 6' of FIG. 31 may be similar to the second circuit layer 6 of FIG. 7. The second circuit layer 6' may include a second alignment portion 63 and a second trace portion 64 electrically connected to the second alignment portion 63. The second alignment portion 63 may define a through hole 631 extending through the second circuit layer 6'.

Figure 32:
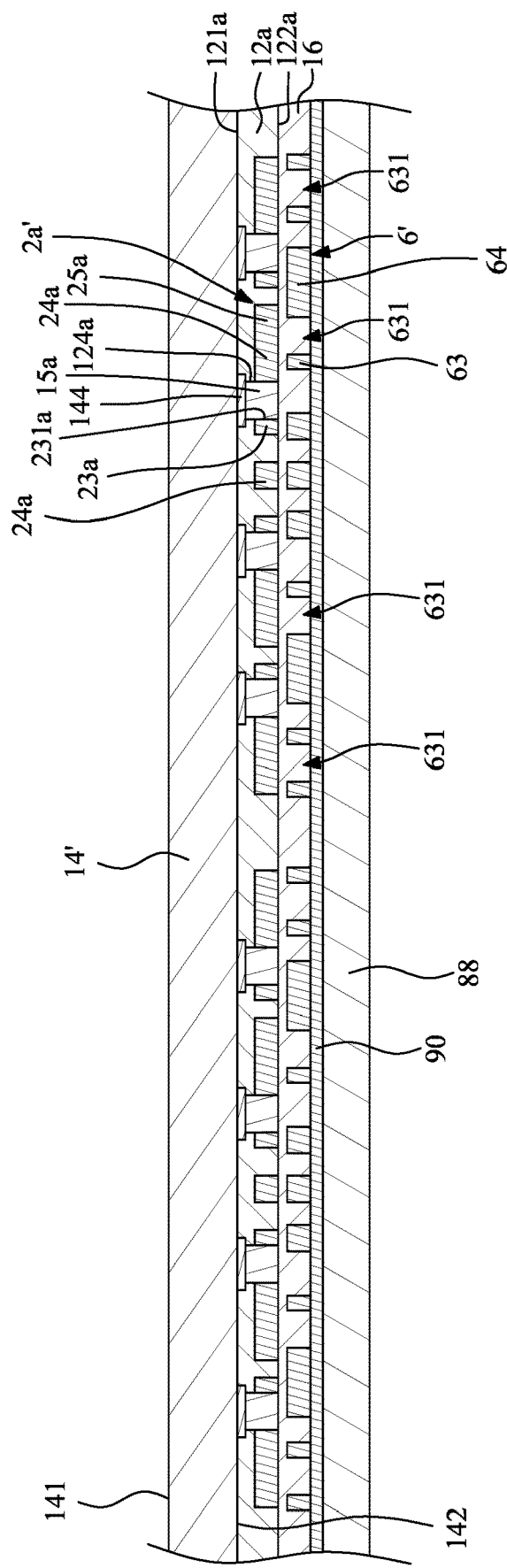
FIG. 32 illustrates one or more stages of an example of a method for manufacturing a package structure according to some embodiments of the present disclosure.

Referring to FIG. 32, a second dielectric layer 16 may be formed or disposed on the seed layer 90 on the second carrier 88 to cover the second circuit layer 6'. Then, the structure (including the first circuit layer 2a', the first dielectric layer 12a and the electrical device 14') of FIG. 30 is attached to the second dielectric layer 16.

Figure 33:
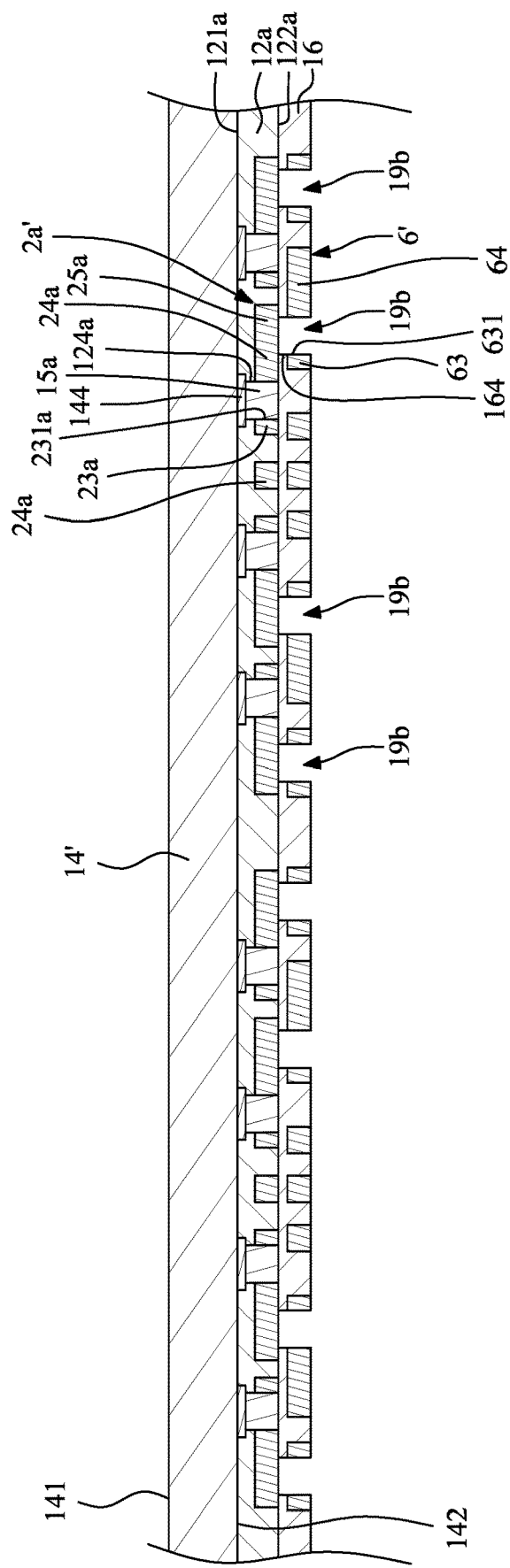
FIG. 33 illustrates one or more stages of an example of a method for manufacturing a package structure according to some embodiments of the present disclosure.

Referring to FIG. 33, the second carrier 88 and the seed layer 90 may be removed. Then, a portion of the second dielectric layer 16 may be removed by, for example, laser drilling, so as to form or define a cavity 19b to expose a portion of the first circuit layer 2a'. The cavity 19b may include the through hole 631 of the second alignment portion 63 and a through hole 164 of the second dielectric layer 16.

Figure 34:
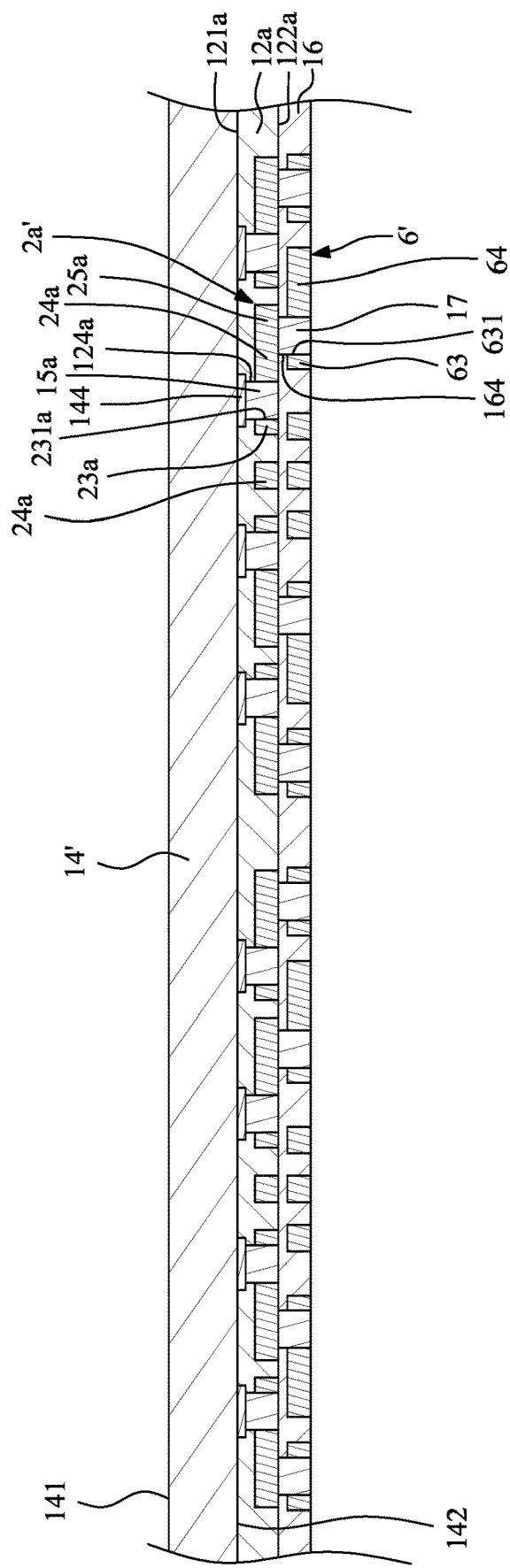
FIG. 34 illustrates one or more stages of an example of a method for manufacturing a package structure according to some embodiments of the present disclosure.

Referring to FIG. 34, a conductive material (e.g., copper paste) may be formed or disposed in the cavity 19b by, for example, plating, so as to form a second conductive structure 17. Thus, the second conductive structure 17 may be formed or disposed in the through hole 164 of the second dielectric layer 16 and the through hole 631 of the second alignment portion 63 of the second circuit layer 6'. Thus, the second conductive structures 17 may extend through the second dielectric layer 16 and the second alignment portion 63 of the second circuit layer 6', and connects to the first circuit layer 2a'.

Then, a protection layer 18 (e.g., solder mask) may be formed or disposed on the bottom surface of the second dielectric layer 16 and the bottom surface of the second circuit layer 6'. Further, the protection layer 18 may define a plurality of openings 183 to expose portions of the second alignment portion 63 of the second circuit layer 6' and/or a portion (e.g., a bottom surface) of the second conductive structure 17. Then, a plurality of external connectors 4 (e.g., solder balls or solder bumps) may be formed or disposed in the openings 183 of the protection layer 18 and on the exposed portions of the second alignment portion 63 of the second circuit layer 6' and/or the exposed portions of the second conductive structure 17. Then, a singulation process may be conducted so as to obtain a plurality of package structures 1a shown in FIG. 7.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   a first circuit layer including a first alignment portion;
   a first dielectric layer covering the first circuit layer;
   an electrical device disposed on the first dielectric layer, and including an electrical contact aligning with the first alignment portion;
   a first conductive structure extending through the first alignment portion, and electrically connecting the electrical contact and the first alignment portion;
   a second dielectric layer disposed on the first dielectric layer, wherein the second dielectric layer defines an opening exposing a portion of a bottom surface of the first conductive structure, wherein in a cross-sectional view, a width of the opening of the second dielectric layer is less than a width of the bottom surface of the first conductive structure; and
   a conductive via disposed in the opening of the second dielectric layer, wherein in a cross-sectional view, a width of the conductive via reduces toward the first conductive structure.

2. The package structure of claim 1, wherein the first alignment portion and the first conductive structure are not formed concurrently.

3. The package structure of claim 1, wherein a lateral side surface of the first conductive structure is physically connected to the first alignment portion of the first circuit layer directly.

4. The package structure of claim 1, wherein a top surface of the first conductive structure is physically connected to the electrical contact of the electrical device directly.

5. The package structure of claim 1, further comprising:
   an encapsulant covering the electrical device and the first dielectric layer, wherein a lateral side surface of the encapsulant is substantially coplanar with a lateral side surface of the first dielectric layer.

6. The package structure of claim 1, further comprising a solder disposed on the first conductive structure, wherein a width of the solder is greater than a width of the first conductive structure.

7. The package structure of claim 1, wherein a thickness of the first conductive structure is greater than a thickness of the first circuit layer.

8. The package structure of claim 7, wherein the first dielectric layer contacts a lateral surface of the first circuit layer.

9. The package structure of claim 1, wherein first alignment portion contacts a portion of a lateral surface of the first conductive structure.

10. The package structure of claim 9, wherein first alignment portion is around the first conductive structure.

11. The package structure of claim 1, wherein a diameter of an opening of the first alignment portion is less than a width of the electrical contact.

12. The package structure of claim 11, wherein a width of the first conductive structure is less than a width of the electrical contact.

* * * * *